United States Patent [19]
Kuijsten

[11] Patent Number: 5,920,712
[45] Date of Patent: Jul. 6, 1999

[54] EMULATION SYSTEM HAVING MULTIPLE EMULATOR CLOCK CYCLES PER EMULATED CLOCK CYCLE

[75] Inventor: Han Kuijsten, Oakland, Calif.

[73] Assignee: Quickturn Design Systems, Inc., Mountain View, Calif.

[21] Appl. No.: 08/748,154

[22] Filed: Nov. 12, 1996

Related U.S. Application Data

[63] Continuation of application No. 08/242,164, May 13, 1994, abandoned.

[51] Int. Cl.⁶ ...................... G06F 11/267; G06F 15/177; G06F 9/455
[52] U.S. Cl. .................. 395/500; 364/232.3; 364/264.3; 364/270; 364/281.9; 364/DIG. 1
[58] Field of Search ............................. 395/500; 371/16.2

[56] References Cited

U.S. PATENT DOCUMENTS

| | | | |
|---|---|---|---|
| 3,955,180 | 5/1976 | Hirtle | 340/172.5 |
| 4,306,286 | 12/1981 | Cocke et al. | 364/200 |
| 4,357,678 | 11/1982 | Davis | 364/900 |
| 4,527,249 | 7/1985 | Van Brunt | 364/578 |
| 4,583,169 | 4/1986 | Cooledge | 395/500 |
| 4,587,625 | 5/1986 | Marino et al. | 364/578 |
| 4,656,580 | 4/1987 | Hitchcock, Sr. et al. | 364/200 |
| 4,695,968 | 9/1987 | Sullivan, II et al. | 364/200 |
| 4,697,241 | 9/1987 | Lavi | 364/488 |
| 4,725,971 | 2/1988 | Doshi et al. | 364/578 |
| 4,769,817 | 9/1988 | Krohn et al. | 371/23 |
| 4,782,461 | 11/1988 | Mick et al. | 364/900 |
| 4,787,061 | 11/1988 | Nei et al. | 364/900 |
| 4,787,062 | 11/1988 | Nei et al. | 364/900 |
| 4,819,150 | 4/1989 | Jennings et al. | 364/200 |
| 4,862,347 | 8/1989 | Rudy | 364/200 |
| 4,879,646 | 11/1989 | Iwasaki et al. | |
| 4,914,612 | 4/1990 | Beece et al. | 364/578 |
| 4,972,334 | 11/1990 | Yamabe et al. | 364/200 |
| 5,031,129 | 7/1991 | Powell et al. | 364/717 |
| 5,036,473 | 7/1991 | Butts et al. | |
| 5,068,812 | 11/1991 | Schaefer et al. | 364/578 |
| 5,084,824 | 1/1992 | Lam et al. | 364/490 |

(List continued on next page.)

OTHER PUBLICATIONS

M. McFarland et al., "The High–Level Synthesis of Digital Systems," IEEE, 1990 vol. 78, No. 2, pp. 301–316.

"Virtual Wires Published Papers", URL, http:/cag–www.lcs.mit.edu/vwires/papers/index.html, Mar. 26, 1997.

VHDL Mixed–Levl Fault Simulator, URL, http://www.ikos.com/products/voyagerfs/index.html, Mar. 26, 1997.

VirtualLogic SLI Emulation System, VirtualLogic SLI:, URL, http://www.ikos.com/products/vsli, Mar. 26, 1997.

"Logic Emulation for the Masses Arrives", URL,http://www.ikos.com/company/news/pr960916.html, Mar. 26, 1997.

"Ikos Systems to Acquire Virtual Machine Works", http://www.ikos.com/company/news/pr960311.html, Mar. 26, 1997.

Agarwal, Anant, "Virtual Wires TM A Technology for Massive Multi–FPGA systems", Virtual Machine Works (no publication date given).

Goering, R., "Emulation for the Masses", Electronic Engineering Times, Jan. 29, 1996, p. 63.

Sim Express Specifications, Mentor Graphics, Sim Express Hardware Emulator.

Maliniak, L., "Pin Multiplexing Yields Low–Cost Logic Emulation", Jan. 22, 1996.

*Primary Examiner*—Kevin J. Teska
*Assistant Examiner*—Ayni Mohamed
*Attorney, Agent, or Firm*—Lyon & Lyon LLP

[57] ABSTRACT

An emulator system allowing a single cycle in a system clock in a user circuit to be emulated in multiple cycles of the emulator system clock. The emulator system provides a unique architecture permitting gates in the emulator to be used to emulate functions in the user circuit without requiring a fixed correspondence between a gate in the emulator and a gate in the user circuit. The emulator system operates in synchronous and asynchronous clock modes and allows the user system clock to be stopped during emulation in selected modes while still maintaining accurate emulation.

32 Claims, 21 Drawing Sheets

U.S. PATENT DOCUMENTS

| | | | |
|---|---|---|---|
| 5,109,353 | 4/1992 | Sample et al. . | |
| 5,114,353 | 5/1992 | Sample . | |
| 5,126,966 | 6/1992 | Hafeman et al. | 364/500 |
| 5,259,006 | 11/1993 | Price et al. . | |
| 5,321,828 | 6/1994 | Phillips et al. | 395/500 |
| 5,329,470 | 7/1994 | Sample et al. | 364/578 |
| 5,329,471 | 7/1994 | Swoboda et al. . | |
| 5,331,571 | 7/1994 | Aronoff et al. | 364/490 |
| 5,345,580 | 9/1994 | Tamaru et al. . | |
| 5,352,123 | 10/1994 | Sample et al. . | |
| 5,377,123 | 12/1994 | Hyman | 364/489 |
| 5,386,550 | 1/1995 | Yumioka et al. | 395/575 |
| 5,396,498 | 3/1995 | Lestral et al. . | |
| 5,425,036 | 6/1995 | Liu et al. | 371/23 |
| 5,437,037 | 7/1995 | Furuichi | 395/700 |
| 5,448,496 | 9/1995 | Butts et al. . | |
| 5,448,522 | 9/1995 | Huang . | |
| 5,452,231 | 9/1995 | Butts et al. . | |
| 5,452,239 | 9/1995 | Dai et al. . | |
| 5,475,624 | 12/1995 | West | 364/578 |
| 5,475,830 | 12/1995 | Chen et al. . | |
| 5,477,475 | 12/1995 | Sample et al. . | |
| 5,551,013 | 8/1996 | Beausoleil et al. | 395/500 |
| 5,572,710 | 11/1996 | Asano et al. | 395/500 |

KEY TO FIG. 5A

| FIG. 5A-1 | FIG. 5A-2 |

| TIMESLOT | 0 | 1 | 2 |
|---|---|---|---|
| P0-S0 P0-S1 | BUFFER N83 COUNT | N52 | N83 |
| P1-S0 P1-S1 | BUFFER N101 RESET | N42 | N101 |
| P2-S0 P2-S1 | BUFFER N106 | N33 | N106 |
| P3-S0 P3-S1 | | N16 | OUTPUT |
| OTHER INSTRUCTIONS | WRITE OUTPUT TO USER OUT | | LATCH INPUTS END CYCLE |

FIG. 10

| TIMESLOT | 0 | 1 | 2 |
|---|---|---|---|
| PROCESSOR 0 SUB 0 | BUFFER N83 | NOT N52 | N83 |
| GATE 0 OPERAND 0 SELECT: OPERAND 0 POLARITY: OPERAND 1..7 SELECT: OPERAND 1..7 POLARITY: GATE 0 ENABLE: GATE 0 OUTPUT POLARITY: | BUS P0S0 (N83) TRUE BUS P0S0 TRUE ENABLE TRUE | BUS P0S1 (COUNT) INVERT BUS P0S0 (N83 BUFFER) INVERT ENABLE TRUE | BUS P0S0 (N52) INVERT BUS P0S0 INVERT ENABLE TRUE |
| GATE 1 OPERAND 0 SELECT: OPERAND 0 POLARITY: OPERAND 1..7 SELECT: OPERAND 1..7 POLARITY: GATE 1 ENABLE: GATE 1 OUTPUT POLARITY: | DISABLE | BUS P0S1 (COUNT) TRUE BUS P0S0 (N83 BUFFER) TRUE ENABLE TRUE | DISABLE |
| GATE 2 OPERAND 0..7 SELECT: OPERAND 0..7 POLARITY: GATE 2 ENABLE: GATE 2 OUTPUT POLARITY: | DISABLE | BUS P1S1 (RESET) TRUE ENABLE TRUE | DISABLE |
| GATE 3 THROUGH 5 ENABLE: | DISABLE | DISABLE | DISABLE |
| SUB 1 | COUNT | | |
| GATE 6 OPERAND 0..7 SELECT: OPERAND 0..7 POLARITY: GATE 6 ENABLE: GATE 6 POLARITY: | SELECT P0 DELAY 0 (INPUT COUNT) TRUE ENABLE TRUE | DISABLE | DISABLE |
| GATE 7 GATE 7 ENABLE: | DISABLE | DISABLE | DISABLE |

FIG. 11A

| TIMESLOT | 0 | 1 | 2 |
|---|---|---|---|
| PROCESSOR 1 | | | |
| SUB 0 | BUFFER N101 | NOT N42 | N101 |
| GATE 0 OPERAND 0 SELECT: OPERAND 0 POLARITY: OPERAND 1 .. 7 SELECT: OPERAND 1 .. 7 POLARITY: GATE 0 ENABLE: GATE 0 OUTPUT POLARITY: | BUS P1S0 (N101) TRUE BUS P1S0 TRUE ENABLE TRUE | BUS P0S0 (N83 BUFFER) INVERT BUS P1S0 (N101 BUFFER) INVERT ENABLE TRUE | BUS P1S0 (N42) INVERT BUS P1S0 INVERT ENABLE TRUE |
| GATE 1 OPERAND 0 SELECT: OPERAND 0 POLARITY: OPERAND 1 .. 7 SELECT: OPERAND 1 .. 7 POLARITY: GATE 1 ENABLE: GATE 1 OUTPUT POLARITY: | DISABLE | BUS P0S1 (COUNT) INVERT BUS P1S0 (N101 BUFFER) INVERT ENABLE TRUE | DISABLE |
| GATE 2 OPERAND 0 SELECT: OPERAND 0 POLARITY: OPERAND 1 SELECT: OPERAND 1 POLARITY: OPERAND 2 .. 7 SELECT: OPERAND 2 .. 7 POLARITY: GATE 2 ENABLE: GATE 2 OUTPUT POLARITY: | DISABLE | SELECT P0S0 (N83 BUFFER) TRUE SELECT P1S0 (N101 BUFFER) TRUE BUS P0S1 (COUNT) TRUE ENABLE TRUE | DISABLE |
| GATE 3 OPERAND 1 .. 7 SELECT: OPERAND 1 .. 7 POLARITY: GATE 3 ENABLE GATE 3 OUTPUT POLARITY | DISABLE | SELECT P1S1 (RESET) TRUE ENABLE TRUE | |
| GATE 4 AND 5 ENABLE: | DISABLE | DISABLE | DISABLE |
| SUB 1 | RESET | | |
| GATE 6 OPERAND 0 .. 7 SELECT: OPERAND 0 .. 7 POLARITY: GATE 6 ENABLE: GATE 6 OUTPUT POLARITY: | SELECT P1 DELAY 0 (INPUT RESET) TRUE ENABLE TRUE | DISABLE | DISABLE |
| GATE 7 GATE 7 ENABLE: | DISABLE | DISABLE | DISABLE |

FIG. 11B

| TIMESLOT | 0 | 1 | 2 |
|---|---|---|---|
| PROCESSOR 2 SUB 0 | BUFFER N106 | NOT N33 | N106 |
| GATE 0<br>OPERAND 0 SELECT:<br>OPERAND 0 POLARITY:<br>OPERAND 1..7 SELECT:<br>OPERAND 1..7 POLARITY:<br>GATE 0 ENABLE:<br>GATE 0 OUTPUT POLARITY: | BUS P2S0 (N106)<br>TRUE<br>BUS P2S0<br>TRUE<br>ENABLE<br>TRUE | BUS P0S0 (N83 BUFFER)<br>INVERT<br>BUS P2S0 (N106 BUFFER)<br>INVERT<br>ENABLE<br>TRUE | BUS P1S0 (N42)<br>INVERT<br>BUS P1S0<br>INVERT<br>ENABLE<br>TRUE |
| GATE 1<br>OPERAND 0 SELECT:<br>OPERAND 0 POLARITY:<br>OPERAND 1..7 SELECT:<br>OPERAND 1..7 POLARITY:<br>GATE 1 ENABLE:<br>GATE 1 OUTPUT POLARITY: | <br><br><br><br>DISABLE | BUS P1S0 (N101 BUFFER)<br>INVERT<br>BUS P2S0 (N106 BUFFER)<br>INVERT<br>ENABLE<br>TRUE | <br><br><br><br>DISABLE |
| GATE 2<br>OPERAND 0 SELECT:<br>OPERAND 0 POLARITY:<br>OPERAND 1..7 SELECT:<br>OPERAND 1..7 POLARITY:<br>GATE 1 ENABLE:<br>GATE 1 OUTPUT POLARITY: | <br><br><br><br>DISABLE | BUS P0S1 (COUNT)<br>INVERT<br>BUS P2S0 (N106 BUFFER)<br>INVERT<br>ENABLE<br>TRUE | <br><br><br><br>DISABLE |
| GATE 3<br>OPERAND 0 SELECT:<br>OPERAND 0 POLARITY:<br>OPERAND 1 SELECT:<br>OPERAND 1 POLARITY:<br>OPERAND 2 SELECT:<br>OPERAND 2 POLARITY:<br>OPERAND 3..7 SELECT:<br>OPERAND 3..7 POLARITY:<br>GATE 2 ENABLE:<br>GATE 2 OUTPUT POLARITY: | <br><br><br><br><br><br><br><br>DISABLE | SELECT P0S0 (N83 BUFFER)<br>TRUE<br>SELECT P1S0 (N101 BUFFER)<br>TRUE<br>SELECT P2S0 (N106 BUFFER)<br>TRUE<br>BUS P0S1 (COUNT)<br>TRUE<br>ENABLE<br>TRUE | <br><br><br><br><br><br><br><br>DISABLE |
| GATE 4<br>OPERAND 1..7 SELECT:<br>OPERAND 1..7 POLARITY:<br>GATE 3 ENABLE<br>GATE 3 OUTPUT POLARITY | <br><br>DISABLE | SELECT P1S1 (RESET)<br>TRUE<br>ENABLE<br>TRUE | |
| GATE 5<br>ENABLE: | DISABLE | DISABLE | DISABLE |
| SUB 1 | | | |
| GATE 6 AND 7<br>GATE 6 AND 7 ENABLE: | DISABLE | DISABLE | DISABLE |

FIG. 11C

| TIMESLOT | 0 | 1 | 2 |
|---|---|---|---|
| PROCESSOR 3 SUB 0 | | NOT N16 | OUTPUT |
| GATE 0<br>OPERAND 0 SELECT:<br>OPERAND 0 POLARITY:<br>OPERAND 1..7 SELECT:<br>OPERAND 1..7 POLARITY:<br>GATE 0 ENABLE:<br>GATE 0 OUTPUT POLARITY: | DISABLE | BUS P0S0 (N83 BUFFER)<br>INVERT<br>BUS P3D0 (OUTPUT DELAYED BY 1 CLOCK)<br>INVERT<br>ENABLE<br>TRUE | BUS P1S0 (N42)<br>INVERT<br>BUS P1S0<br>INVERT<br>ENABLE<br>TRUE |
| GATE 1<br>OPERAND 0 SELECT:<br>OPERAND 0 POLARITY:<br>OPERAND 1..7 SELECT:<br>OPERAND 1..7 POLARITY:<br>GATE 1 ENABLE:<br>GATE 1 OUTPUT POLARITY: | DISABLE | BUS P1S0 (101 BUFFER)<br>INVERT<br>BUS P3D0 (OUTPUT DELAYED BY 1 CLOCK)<br>INVERT<br>ENABLE<br>TRUE | DISABLE |
| GATE 2<br>OPERAND 0 SELECT:<br>OPERAND 0 POLARITY:<br>OPERAND 1..7 SELECT:<br>OPERAND 1..7 POLARITY:<br>GATE 1 ENABLE:<br>GATE 1 OUTPUT POLARITY: | DISABLE | BUS P2S0 (N106 BUFFER)<br>INVERT<br>BUS P3D0 (OUTPUT DELAYED BY 1 CLOCK)<br>INVERT<br>ENABLE<br>TRUE | DISABLE |
| GATE 3<br>OPERAND 0 SELECT:<br>OPERAND 0 POLARITY:<br>OPERAND 1..7 SELECT:<br>OPERAND 1..7 POLARITY:<br>GATE 1 ENABLE:<br>GATE 1 OUTPUT POLARITY: | DISABLE | BUS P0S1 (COUNT)<br>INVERT<br>BUS P3D0 (OUTPUT DELAYED BY 1 CLOCK)<br>INVERT<br>ENABLE<br>TRUE | DISABLE |
| GATE 4<br>OPERAND 0 SELECT:<br>OPERAND 0 POLARITY:<br>OPERAND 1 SELECT:<br>OPERAND 1 POLARITY:<br>OPERAND 2 SELECT:<br>OPERAND 2 POLARITY:<br>OPERAND 3 SELECT:<br>OPERAND 3 POLARITY:<br>OPERAND 4..7 SELECT:<br>OPERAND 4..7 POLARITY:<br>GATE 2 ENABLE:<br>GATE 2 OUTPUT POLARITY: | | SELECT P0S0 (N83 BUFFER)<br>TRUE<br>SELECT P1S0 (N101 BUFFER)<br>TRUE<br>SELECT P2S0 (N106 BUFFER)<br>TRUE<br>BYS O3D0 (OUTPUT DELAYED BY 1 CLOCK)<br>TRUE<br>BUS P0S1 (COUNT)<br>TRUE<br>ENABLE<br>TRUE | DISABLE |
| GATE 5<br>OPERAND 1..7 SELECT:<br>OPERAND 1..7 POLARITY:<br>GATE 3 ENABLE<br>GATE 3 OUTPUT POLARITY | DISABLE | SELECT P1S1 (RESET)<br>TRUE<br>ENABLE<br>TRUE | |
| SUB 1 | | | |
| GATE 6 AND 7<br>GATE 6 AND 7 ENABLE: | DISABLE | DISABLE | DISABLE |

FIG. 11D

EMULATION SYSTEM HAVING MULTIPLE EMULATOR CLOCK CYCLES PER EMULATED CLOCK CYCLE

This application is a continuation of application Ser. No. 08/242,164, filed May 13, 1994, now abandoned.

BACKGROUND OF THE INVENTION

This invention relates generally to digital emulation systems and specifically to a multiprocessor based digital emulation system.

Emulation systems, or emulators, are used to test the operation of new circuits being designed. Emulators also provide circuit designers with the convenience of being able to design and test circuitry that interfaces with the emulated circuit since emulators have inputs and outputs that mimic the operation of the new circuit.

Some emulation systems are software based and run on general purpose computers. These software emulation systems are only useful for emulation where the emulated circuit is not very complex and not very fast. As the complexity and speed of the emulated circuit increases it is necessary to move more of the emulated functions into hardware. While this improves the speed of the emulation it also makes the emulation system increasingly dedicated to the emulation of one specific circuit. An extreme example of hardware "emulation" of a circuit is using field programmable gate array (FPGA) chips configured to perform all of the functions of the emulated circuitry. However, once configured the FPGAs are difficult to change in order to, for example, correct bugs in the circuit or accommodate design changes.

Other tools for circuit designers include "simulators" such as the simulator disclosed in U.S. Pat. No. 4,697,241 by Lavi which achieve a degree of configurability while operating at high speed. However, simulators such as that disclosed in the Lavi patent differ from emulators in that a simulator does not allow interfacing circuitry to be tested. This is because a simulator does not simulate the real-time operation of the new circuit but merely computes the outputs of the circuit given a pattern of signals at the new circuit's inputs. While this is adequate for checking the validity of the new circuit's logic, it falls short of allowing circuit designer's to rapidly prototype and modify a new design while detecting both logical and timing errors when the circuitry runs at the targeted operational clock frequencies.

Therefore, it is desirable to have an emulation system that is able to easily emulate various complex and fast circuits at the circuits' intended operational speeds.

SUMMARY OF THE INVENTION

The present invention provides advantages over prior art digital emulators by using multiple emulator clock cycles to emulate a single cycle in a user's circuit being emulated. The use of multiple emulator clock cycles per emulated cycle allows the emulator's combinatorial logic gates to be used multiple times, and allows gates in the emulator to process multiple gates in a user's logic description without requiring any continued correspondence of emulator gates to user gates. This allows faster emulation of complex user circuits while using less hardware than in prior art systems.

An embodiment of the present invention provides an emulator for emulating the operation of a user circuit. The user circuit is described by logic equations and includes a user clock signal having a user frequency, the emulator includes the following: clock generation means coupled to the user clock signal for generating an emulator clock signal that is an integer multiple, n, times faster than the user frequency, wherein n is greater than 1; processing means for generating solutions to logic equations that emulate the user circuit; and control means coupled to the processing means for controlling the solution of the logic equations, wherein the control means is further coupled to the emulator clock signal and causes one or more logic equations to be solved each n cycles of the emulator clock.

The present invention also provides a method for emulating a user circuit design. A description of the user circuit design is compiled into boolean equations. These equations typically describe functions that are performed in the user's circuit within a single clock cycle in the user system. The emulator system clock operates at a frequency, n, that is a whole number multiple of the user frequency. The n emulator clock cycles per user system clock cycle are used to solve each boolean equation describing the function performed by the user circuit within a given clock cycle. A first emulator cycle is used to solve a first portion of a given boolean equation. Additional emulator cycles are used to solve the remainder of the given boolean equation so that the solution of the boolean equation is obtained within the given user system clock cycle being emulated. Finally, the solution of the boolean equation is used in the emulation of the user circuit.

BRIEF DESCRIPTION OF THE DRAWINGS

FIGS. 5A-1 and 5A-2 shows circuitry for level 2 processing;

FIGS. 5B-1 and 5B-2 shows a portion of specific circuitry to accomplish a first function represented in FIG. 2;

FIGS. 5C-1 and FIGS. 5C-2 shows a portion of specific circuitry to accomplish a second function represented in FIG. 2;

FIG. 10 shows a processor map of an emulator control program;

FIG. 11A is a first table of pseudo code;

FIG. 11B is a second table of pseudo code;

FIG. 11C is a third table of pseudo code;

FIG. 11D is a fourth table of pseudo code; and

DESCRIPTION OF THE PREFERRED EMBODIMENT

The present invention includes a method for emulating a digital system and a specific architecture that provides efficient hardware for implementing the method. The trace hardware used in the emulation system is described in co-pending application Ser. No. 08/197,430.

In discussing the emulation system of the present invention the architecture of the emulation system is described first. Next, an example of a user digital system and a method for utilizing the emulator to emulate the example system is discussed.

Architecture of the Emulation System

Figure 1:
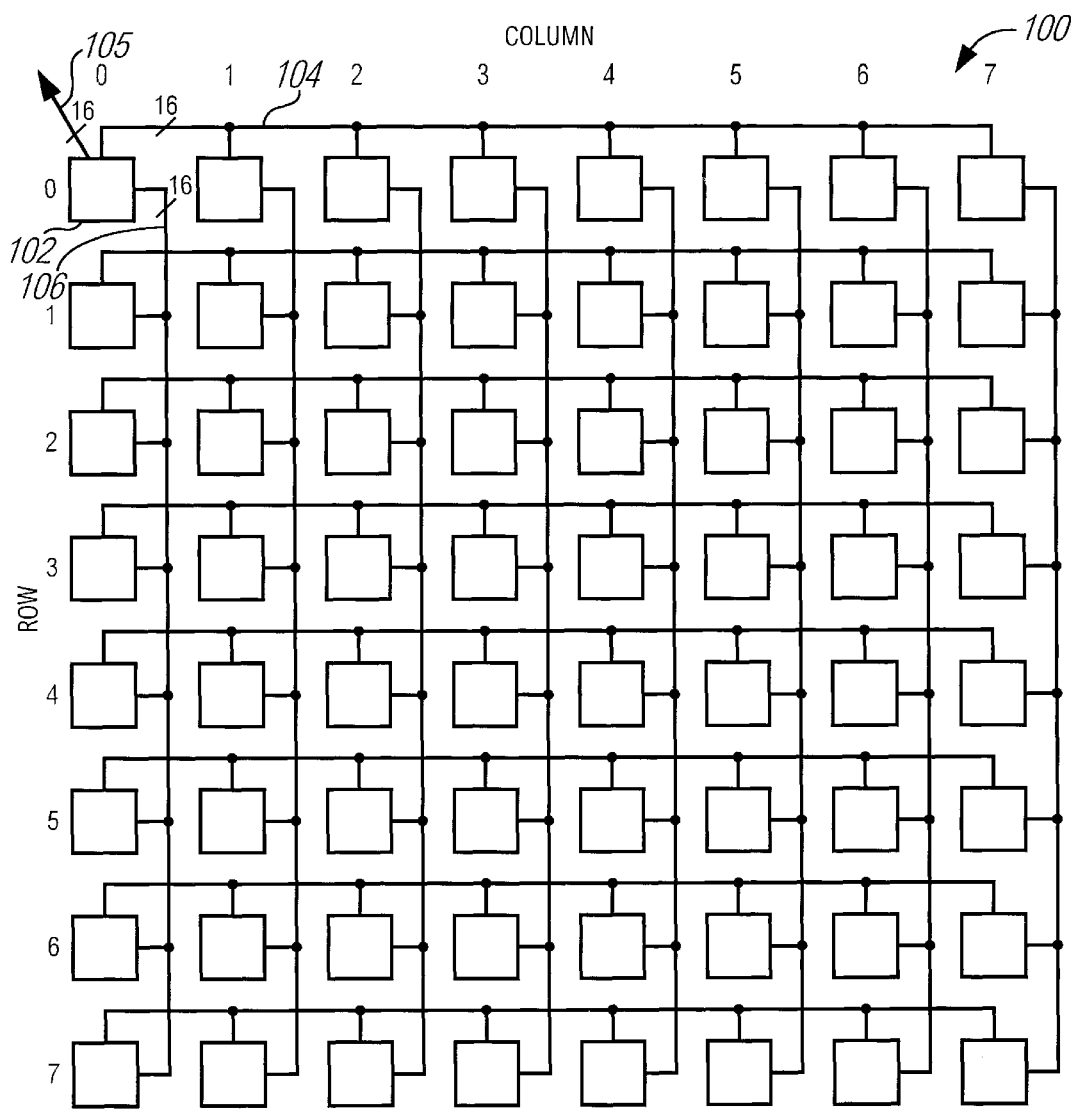
FIG. 1 is a board level diagram of the architecture of the emulation system of the present invention.

FIG. 1 is a board level diagram 100 of the architecture of the emulation system of the present invention. Each board in the emulation system has 64 chips arranged in an 8×8 grid. Chips are designated by their row and column number such as chip 102 at row 0, col 0 (notated as "chip (0,0)"). Each chip may transfer data to another chip in its row or column via a 16-bit bus that connects chips by row, as with bus 104, or by column, as with bus 106. In order for chip (0,0) to communicate with chip (1,1), chip (0,0) must transfer data through either chip (0,1) or chip (1,0).

Additional 16-bit buses allow the chips on board 100 to communicate with chips on other boards (not shown). The other boards are identical in structure to board 100. These "vertical" buses are similar to the row and column buses. Connectors on board 100 that attach vertically, or out of the page of FIG. 1, to adjacent boards allow chips in the same vertical alignment to communicate directly with other chips in the same vertical alignment. An example of a vertical connector is illustrated as arrow 105 for chip (0,0), only. In actuality, the vertical connectors are present for each chip on the board.

Thus, each chip on board 100 has 48 connections to chip-to-chip (CTC) buses arranged as 3 buses of 16 bits each.

Each chip, such as chip 102 of FIG. 1, includes four processors within it. Therefore, each board includes 256 processors which provide a high degree of multiprocessing capability. Additionally, as discussed below, each processor within a chip provides parallel processing operations.

Figure 2:
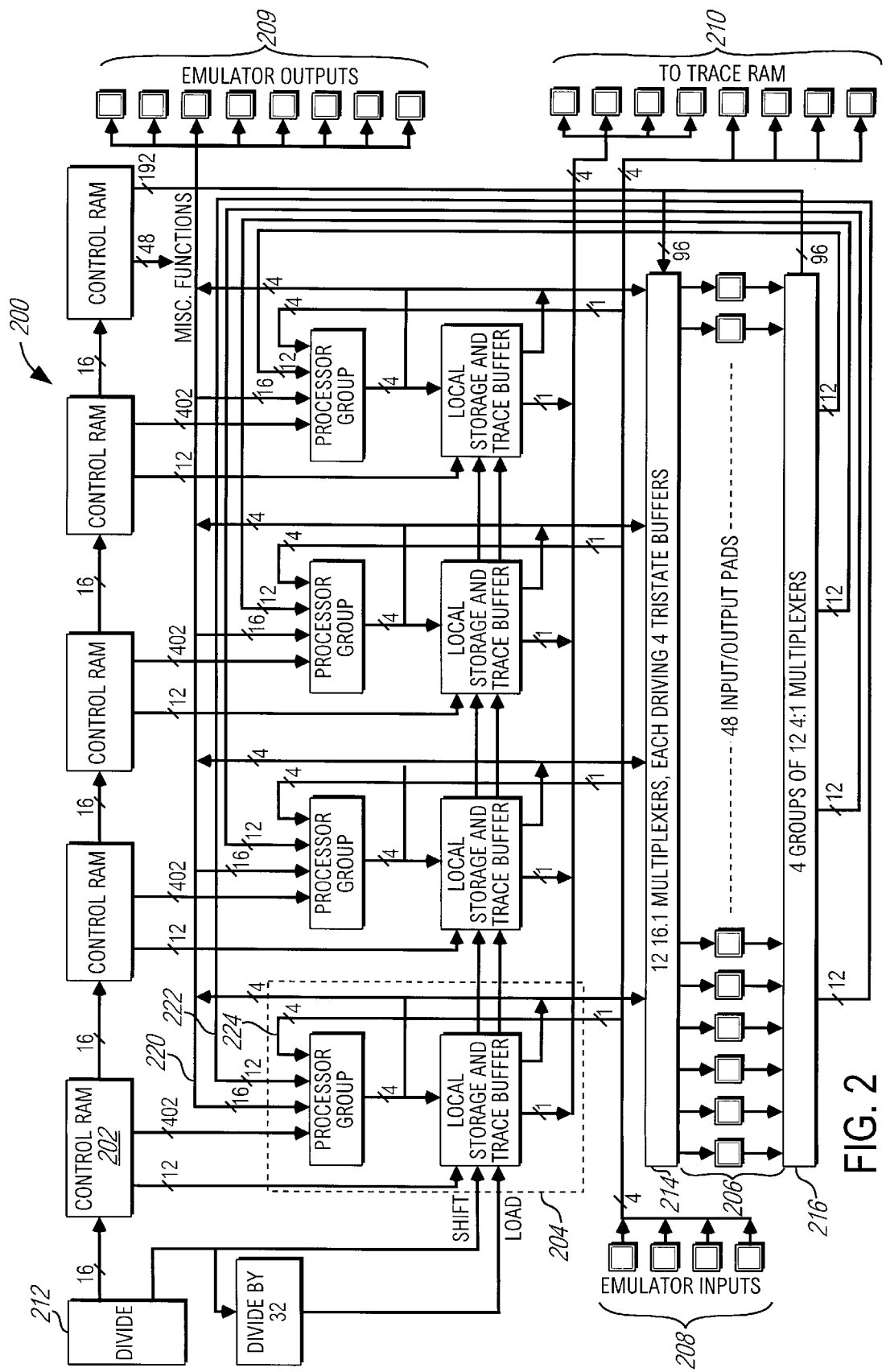
FIG. 2 shows a block diagram for a single chip in the board of FIG. 1.

FIG. 2 shows a block diagram for a single chip in the board 100 of FIG. 1. In FIG. 2, chip 200 includes four instances of a "Processor Group" and "Local Storage & Trace Buffer" combination such as the combination at 204, referred to simply as processor group 204. The operation of each processor group is controlled by an associated Control RAM such as control RAM 202 associated with the processor group at 204. Each processing portion of a processor group communicates with its local storage through buses as shown in FIG. 2. Also, each processor group can communicate with the other processor groups within the chip via internal buses as shown.

Pads for connecting to the external row, column and vertical buses discussed in connection with FIG. 1 are shown at 206 in FIG. 2. Additional pads are shown at 208, 209 and 210. The pads at 208 are used to accept external signals during the course of an emulation run so that the emulator can do "in-circuit" emulation. Pads at 209 are for outputting signals to external circuitry. Pads at 210 are used to perform a tracing function in order to debug and verify the operation of the user circuit being emulated.

In practice, a logical description of a user circuit is converted to Boolean equations. Alternative ways of describing the circuit can be by a hardware description language listing or a net-list corresponding to a schematic diagram. A compiler converts these equations into a series of control statements. These statements are loaded into the control RAM. When the emulator is in operation, the Boolean equations are solved by having the control RAM output route the appropriate variables to the processor groups. The processor groups perform logical operations on the selected values in order to emulate the operation of the user circuit. Thus, the solution of the equations is typically under the control of an "emulator control program" having a fixed number of steps. The number of steps in the program is dependent on the complexity of the circuit to be emulated.

In a preferred embodiment, the number of program steps varies between 4–16. Each step in the program is accomplished in one emulator cycle so that the number of emulator cycles per user cycle is in the range 4–16. The execution "loop" of 4–16 emulator control program steps per user system clock cycle is also referred to as an emulator "program cycle."

The emulation system of the present invention operates in two modes. The first mode is an asynchronous or free-running mode where the emulator system clock is not synchronized to the user, or emulated, system clock. The second mode is a synchronous mode where the emulator clock is locked to the user clock.

In the asynchronous mode the emulator system clock is operated at the maximum frequency permitted by the emulator design. The user system clock is provided as a signal input to one of the emulator input pads such as the pads at 208 of FIG. 2. Any user inputs are also provided to the emulator input pads. The input signals must remain valid for at least one emulator program cycle in order to insure detection by the emulator. Asynchronous mode is generally used where the user clock operates at a rate substantially below the maximum permitted by the emulator system, or where several clocks are used in the circuit none of which is known to be always faster than all others.

The limit on the speed of the user system clock in asynchronous mode is imposed by the requirement that each input remain valid for at least one complete program cycle. At least two emulator program cycles must be executed during one clock cycle. This is because one program cycle is needed per half user clock cycle to handle logic calculations that must be performed when the clock is at logic high and then at logic low. Depending on the equations to be solved during emulation the number of emulator clock cycles per emulator program will vary. Note that in asynchronous mode the emulator clock is not locked to the user clock so that the number of emulator clock cycles per user clock cycle need not be an integer number. The maximum user clock rate in asynchronous mode is equal to fmax/2N where fmax is the maximum emulator system clock frequency and N is the number of steps in the emulator control program.

In the synchronous mode the emulator system clock is locked to the user system clock. The emulator system clock is generated by a clock multiplier circuit from the user system clock and runs at a faster rate than the user system clock. The clock multiplier circuit feeds divider 212 of FIG. 2. The multiplier circuit is not shown in the Figures but may be implemented in a variety of ways as is commonly known in the art.

There are two synchronous modes, a "standard" synchronous mode and an "exception" synchronous mode.

In standard synchronous mode the emulator system clock rate is 2fN where f is the user system clock frequency and N is the number of steps in the emulator's control program. In standard synchronous mode, the user system clock must also be provided as a logic signal input to the emulator at one of the emulator's input pins such as the pins at 208 of FIG. 2.

Since one step of the emulator's control program is executed each emulator clock cycle, an emulator system clock frequency of 2fN means that the emulator executes its control program twice during each user clock cycle. The emulator control program must execute twice within a single user cycle in order to accurately emulate feedback loops in flip-flops in the user circuit. This is discussed in more detail below in the discussion of the execution of the emulator control program. By operating the emulator system clock at the standard synchronous mode rate of 2fN the user is able to stop the user system clock at any time and the emulator will accurately emulate the input and output signals of the user's circuit. This assumes that the emulator clock multiplier circuit is continuously receiving a valid user clock signal.

In exception synchronous mode the emulator control program is executed only once per user system clock cycle. In other words, the emulator system clock rate is fN or half as fast as the standard synchronous mode rate. In the exception synchronous mode the user system clock can not be halted during emulation. An advantage of using the exception synchronous mode rate is that user circuits with faster system clocks can be emulated.

An estimate for the performance of the emulation system is based on each processor in the emulation system emulating 8 gates in the user circuit per processor per emulation cycle. The estimate is then as follows: The minimum system uses 64 chips×4 processor per chip×16 emulation cycles (maximum)×8 gates per processor per emulation cycle=32,768 gates. This means that a single board in the emulation system of the present invention is able to simulate a user circuit design having approximately 32K gates.

Figure 3:
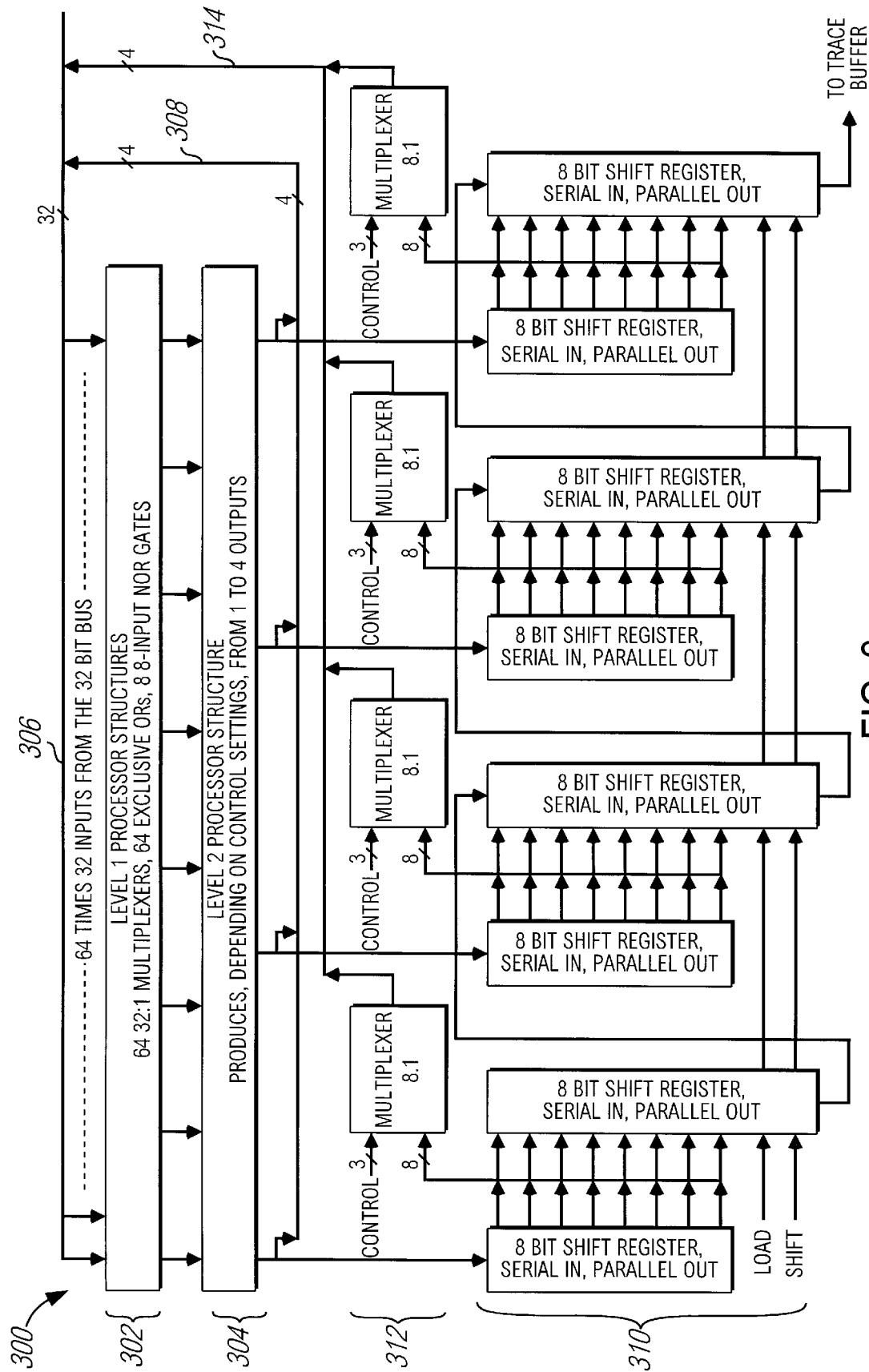
FIG. 3 is a block diagram of a single processor group in the system of FIG. 2.

FIG. 3 is a block diagram of a single processor group in the system of FIG. 2, such as the processor group at 204. In FIG. 3, processor 300 is shown having a level 1 processor structure at 302 and a level 2 processor structure at 304. The 32-bit bus 306 of FIG. 3 is used to transfer variable values to the level 1 processor structures. The signals from 32-bit bus 306 are multiplexed through 64 32:1 multiplexers at 302 of FIG. 3 to selectively provide inputs to each of 8 groups of gate processors discussed below in connection with FIG. 4. The 32-bit bus 306 is made up of three separate sections shown in FIG. 2 as separate buses.

For processor group 204 the 32-bit bus 306 includes a first section of sixteen bits that includes the outputs of all four processors on the chip. This 16-bit section is shown individually in FIG. 2 as bus 220. One fourth of this section is also shown in FIG. 3 as bus 308 that includes the four output bits of the single processor group shown in FIG. 3. The second section is a 12-bit section unique to each processor, coming from the CTC input multiplexers connected to input/output pads at 206. This 12-bit section is shown individually in FIG. 2 as bus 222. The third section is a 4-bit section, again unique to each processor, generated by local storage shift registers. This section is shown as bus 224 in FIG. 2 and is shown in FIG. 3 as bus 314.

Figure 4A:
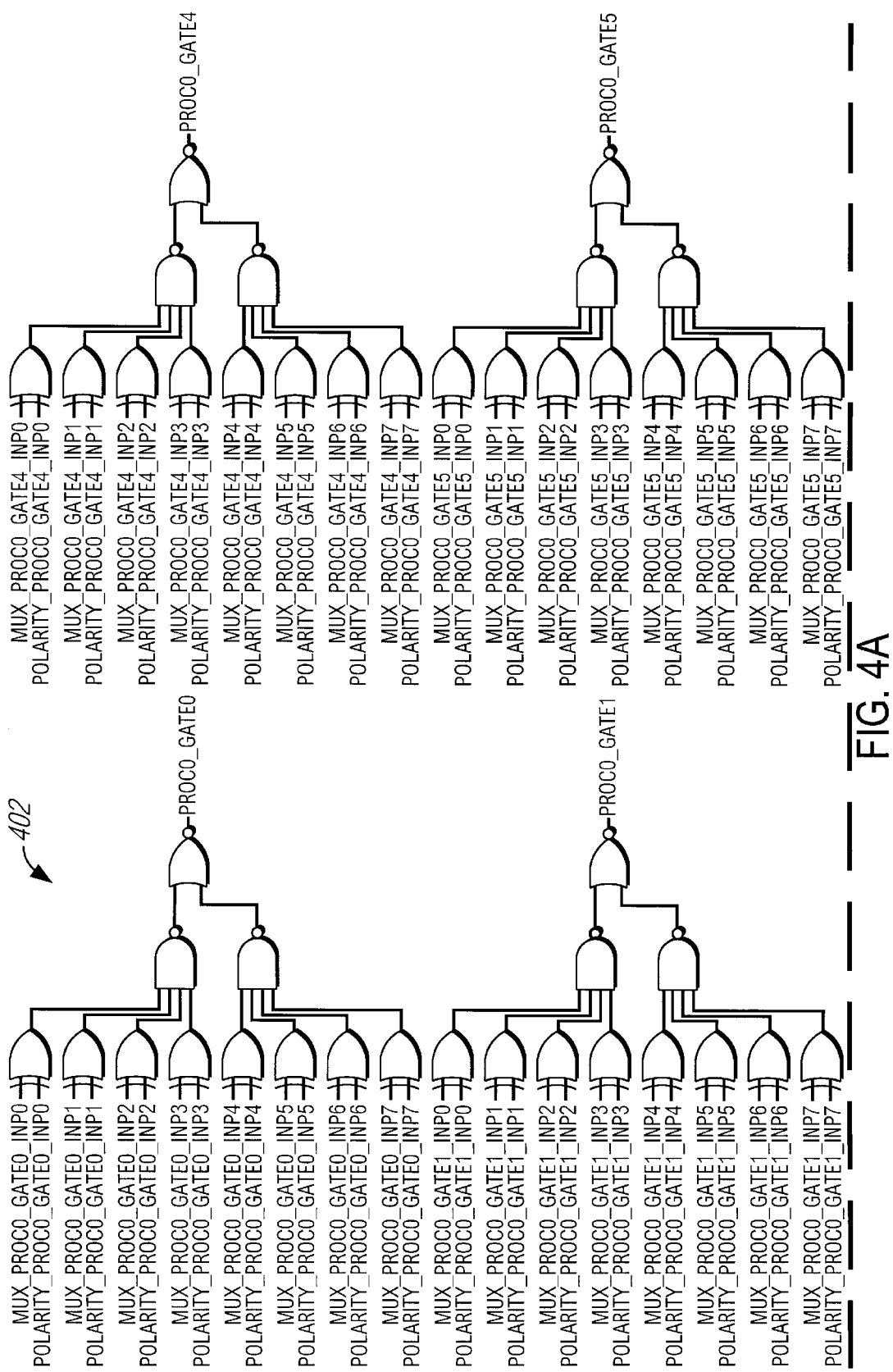
FIG. 4 shows a gate level description of a level 1 processor.
Figure 4B:
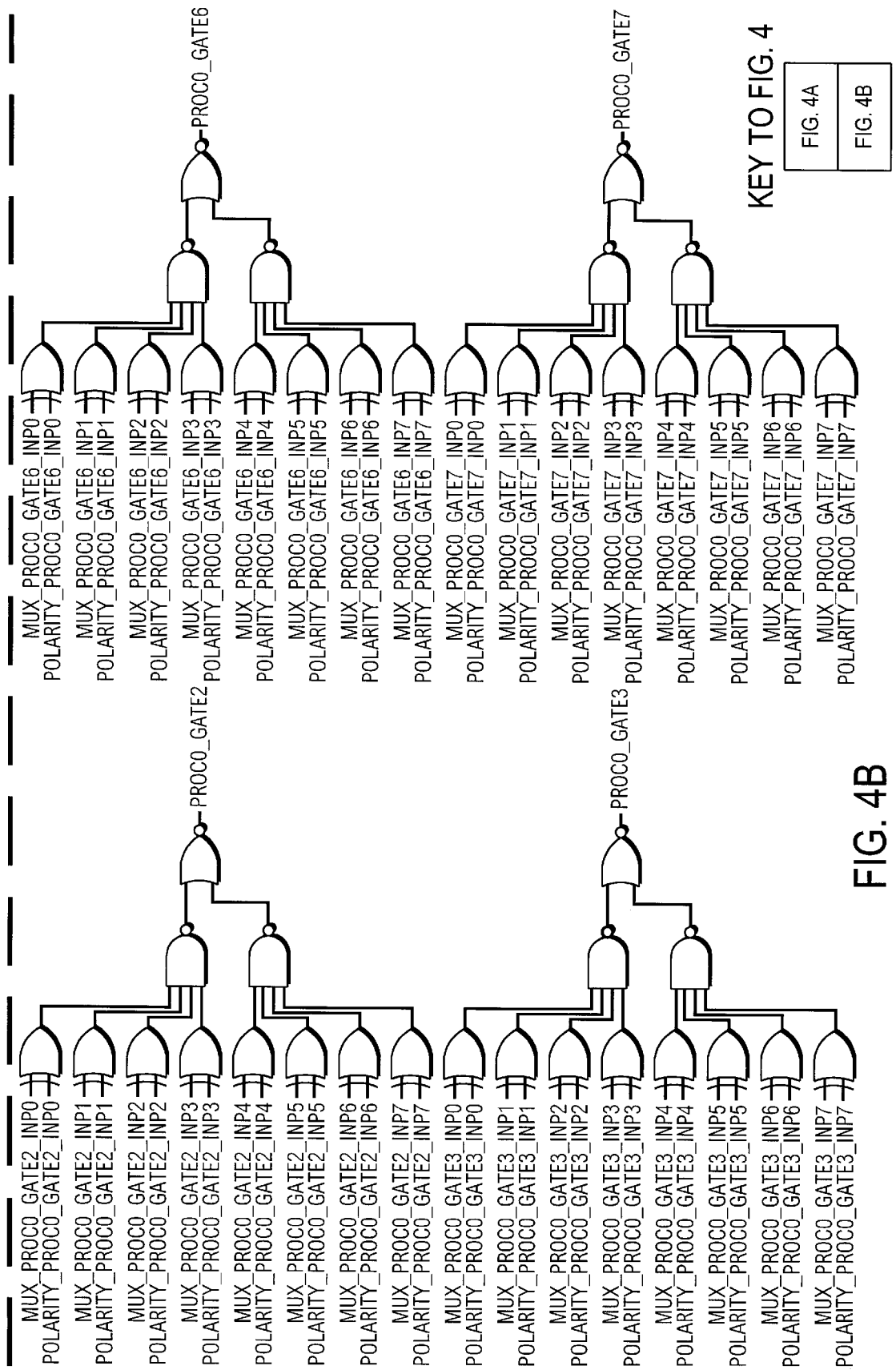

FIG. 4 shows a gate level description of the level 1 processor structure 302 of FIG. 3. Each chip has four processors; proc0, proc1, proc2 and proc3, that are similarly configured. FIG. 4 shows 8 instances of logic gates, gate0 . . . gate7, for computing products in, e.g., proc0. For example, gate0 at 402 is made up of 8 exclusive-OR (XOR) gates. The top 4 XOR gates are connected to a 4 input NAND gate. The bottom 4 XOR gates are connected to a second 4 input NAND gate. The outputs of the NAND gates are connected in a 2 input NOR gate. The output of the NOR gate is the output signal given the label "proc0_gate0."

Figure 3A:
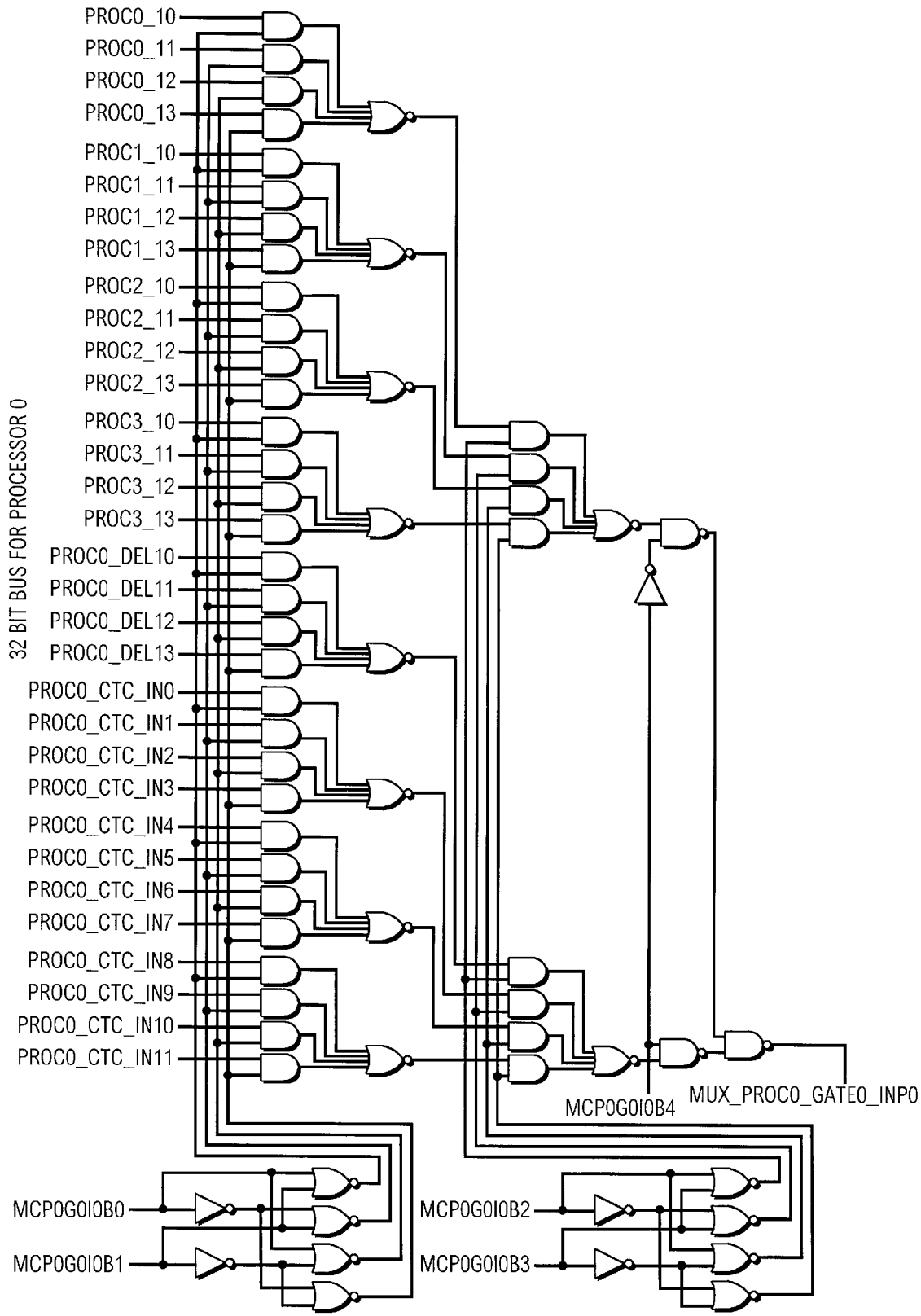
FIG. 3A is an example of a multiplexer used in the system of the present invention.

Each of the XOR gates receives an input from the 32 bit bus 306 of FIG. 3. For example, the topmost input to the topmost XOR gate of FIG. 4 is labeled mux_proc0_gate0_inp0. Each of the other 7 inputs for gate 0 at 402 of FIG. 4 is labeled similarly ending with the suffix "inp1," "inp2,". . . "inp7". In actuality, these inputs are coupled to the 32 bit bus at 306 via 32 to 1 multiplexers. An example of such a multiplexer is shown in FIG. 3A. These multiplexers allow the routing of any one of the 32 signals in the 32 bit bus to any input of the XOR gates of a given processor, such as processor proc0 shown in FIG. 4.

The second input to each XOR gate, such as signal "polarity_proc0_gate0_inp0" is a polarity selection signal that serves to invert the value received from the 32 bit bus if desired. The polarity signals are generated by the control RAM according to the emulator control program.

Using the convention that values on the 32 bit bus are indicated as variables v0–v31, products such as (v17)(not v23)(v8)(v1)(not v5) can be computed. Products of up to 8 variables are possible for each gate. Once the products are computed the outputs proc0_gate0 through proc0_gate7 are sent to the level 2 processor structure for summing.

Figures 1, 5A:
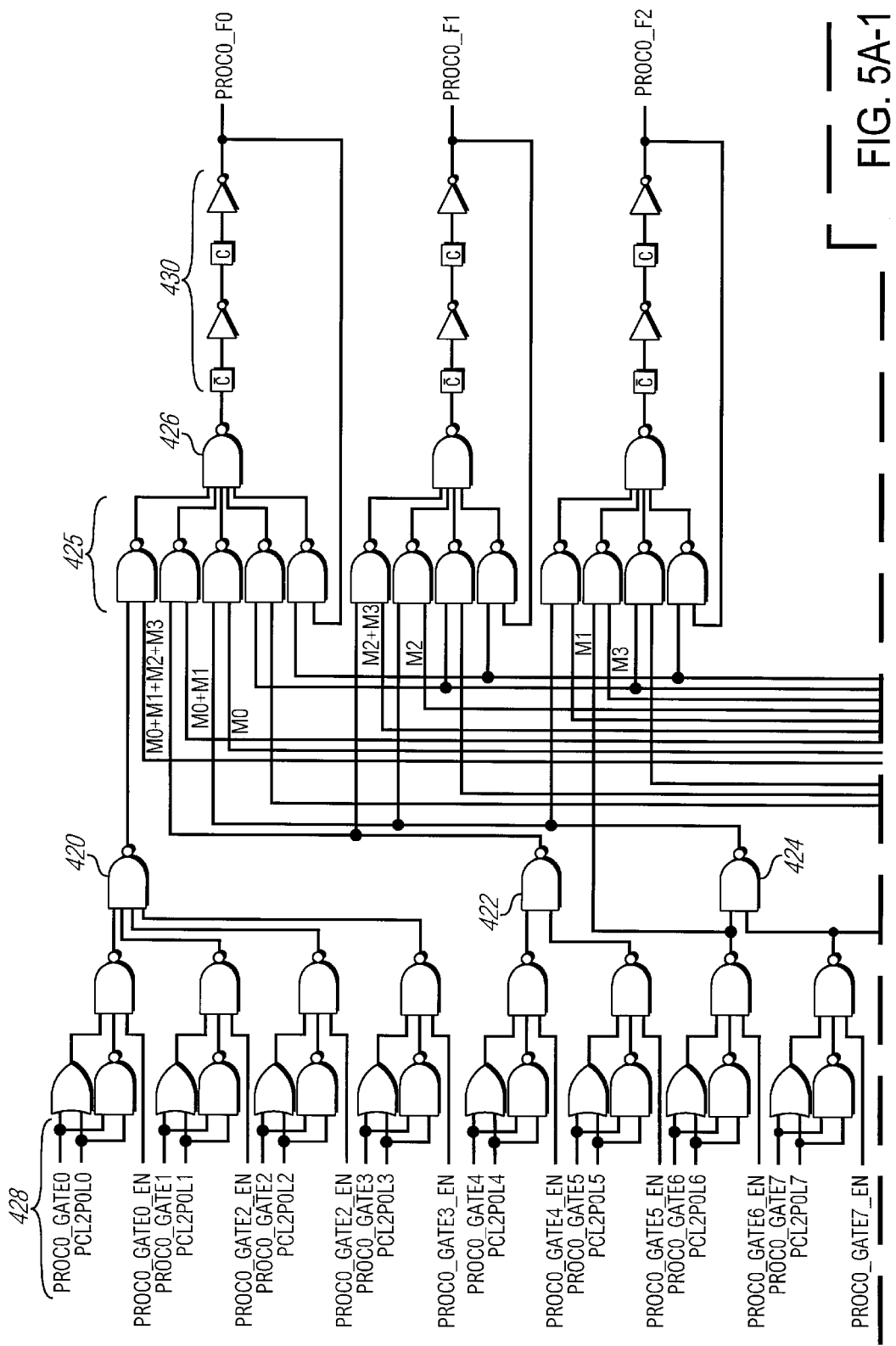
Figures 2, 5A:
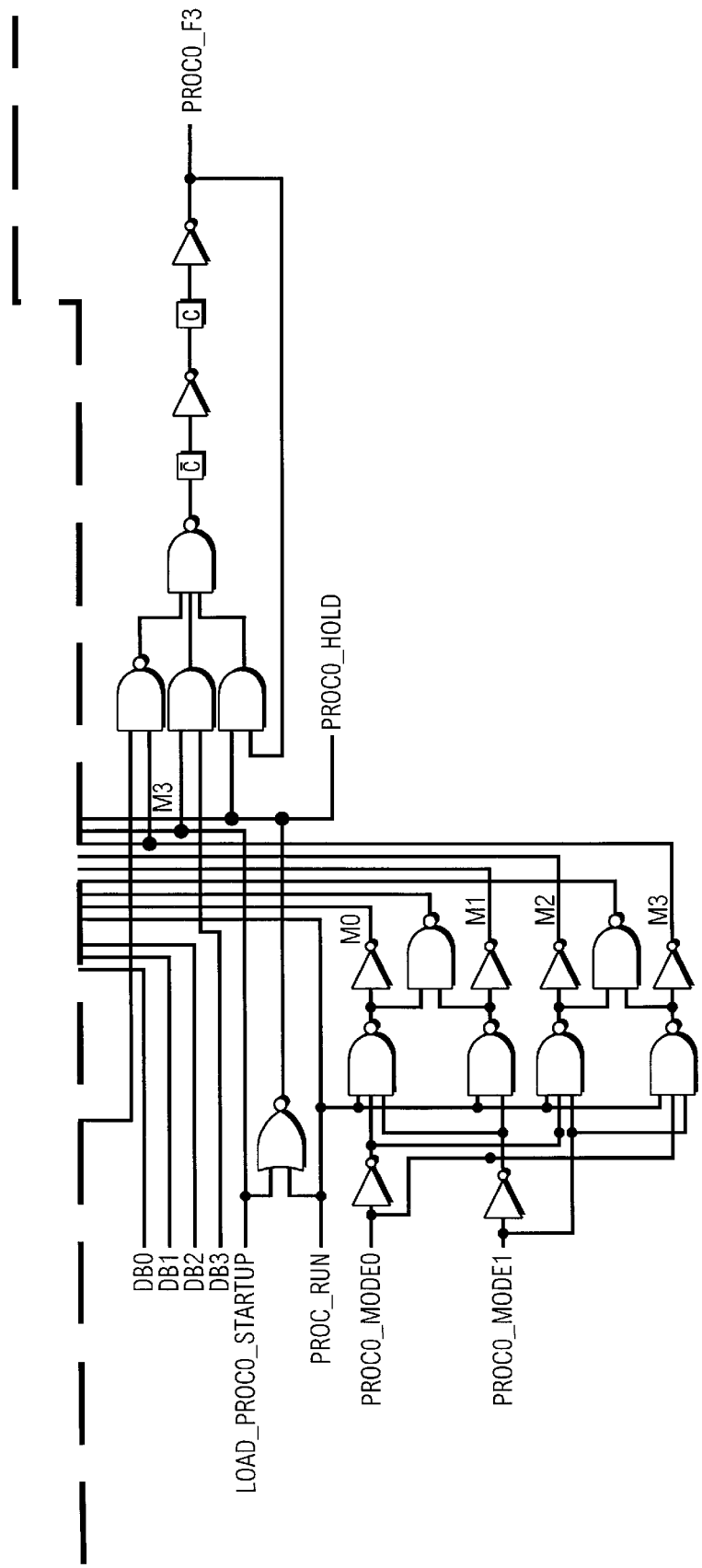

FIGS. 5A-1 and 5A-2 shows circuitry for level 2 processing. The circuitry of FIG. 5 corresponds to the level 2 process structure 304 shown in FIG. 3. FIG. 5 shows second level circuitry for a single processor, "proc0" and its four output signals proc0_f0 through proc0_f3. These four output signals are output onto bus 308 of FIG. 3. This allows the routing of the output signals back in as inputs through the 32 bit bus 306 of FIG. 3.

The proc0_f0 through proc0_f3 signals are also shifted into shift registers at 310 of FIG. 3. The outputs of the shift registers are available as parallel outputs to multiplexers at 312. By using the multiplexers, previous processor outputs can be accessed. The output of a processor can be fed immediately back to the inputs of one of the processors so that accessing a result one cycle, or program step, "back" is possible. The 8 bits stored in the shift registers allow retrieving values computed up to 9 cycles back. Stored processor outputs are available to the processor by re-routing through bus 314 onto bus 306 and back to the inputs of the level 1 processor.

Shift registers at 310 are actually arranged in four groups. Each group includes a shift register for shifting in the output signal of a processor and an 8 bit parallel-in serial-out shift register that implements a trace buffer function as discussed in co-pending patent application Ser. No. 08/197,430.

Returning to FIGS. 5A-1 and 5A-2, combinations of the product sums generated by the first level processor group of FIG. 4 are made available at the processor outputs in the second level circuitry of FIG. 5 as proc0_f0 through proc0_f3. There are four possible modes determining the combinations of product sums at each of the four second level processor outputs. Mode selection is made by the signals proc0_mode0 and proc0_mode1. The mode selection signals are generated by the control RAM 202 of FIG. 2. As an example of a product sum combination, in mode 0, that is, when proc0_mode0 and proc0_mode1 are both high the combination of product sums through NAND gates 420, 422 and 424 will be available through NAND gate 426 at the end of the present clock cycle.

Table 1 below shows each of the four modes for level 2 processing and the functions generated by each mode.

TABLE 1

| Mode | proc0_mode1 | proc0_mode0 | f0 | f1 | f2 | f3 |
|---|---|---|---|---|---|---|
| 0 | 0 | 0 | 8 input | — | — | — |
| 1 | 0 | 1 | 6 input | — | 2 input | — |
| 2 | 1 | 0 | 4 input | 4 input | — | — |
| 3 | 1 | 1 | 4 input | 2 input | 1 input | 1 input |

Thus, for mode 0, the output is on the signal proc0__f0 and is a sum of the 8 products from the level 1 gates, gate0 through gate7. For mode 1, the output is two separate signals, proc0__f0 and proc0__f2, where proc0__f0 in mode 1 is a sum of the products from level 1 gates gate0 through gate5 and proc0__f2 is a sum of the products from level 1 gates gate6 and gate7. Modes 2 and 3 are similarly analyzed.

Signals from the output of the level one processor from FIG. 4 are input to the circuit of FIGS. 5A-1 and 5A-2 at 428. These signals are labelled proc0_gate0 through proc0_gate7. Each of these signals can be inverted and enabled by control signals also at 428. Signals such as pcl2p0i0 ("processor control level 2, processor 0, input 0") control the inversion of a signal while signals such as proc0_gate0_en control the enabling of their corresponding signal. Using the convention of $g_0$ for the proc0_gate0 signal, $g_1$ for proc0_gate1, etc., and assuming the polarity control signal pcl2p0i0 is low, NAND gate 420 produces not((not $g_0$) (not $g_1$) (not $g_2$) (not $g_3$)) which is identical to $g_0+g_1+g_2+g_3$. Similarly, NAND gate 422 produces the combination $g_4+g_5$ while NAND gate 424 produces the combination $g_6+g_7$. NAND gates at 425 and NAND gate 426 further combine these terms so that the output of NAND gate 426 is $g_0+g_1+g_2+g_3+g_4+g_5+g_6+g_7$. This signal is passed to the latch at 430 so that the signal is available at the start of the next clock cycle.

The square symbols within the latch at 430 represent series pass-gates connected to the clock and clock-bar lines in the system in such a way that the pass-gate with the "C-bar" label passes its signal during the clock low while the pass gate with the "C" label passes its signal during the clock high.

By using the gates shown in FIGS. 4, 5A-1 and 5A-2 it is possible to perform a wide variety of the input signals with the input signals. Many logic combinations, ranging from a 64-input OR gate to 64-input AND gate, are possible. For example, an 18 input OR gate with two inputs connected to the outputs of two 8-input AND gates is one of many such logic combinations configurable from the gates of FIGS. 4, 5A-1 and 5A-2. The configuring of the gates of FIGS. 4,5A-1 and 5A-2 is via the enable and inversion signals under control of the emulator control program. Each logical combination of the inputs is computed in one emulator system clock cycle and the gates are re-configurable by the control program to perform a different computation at the next emulator system clock cycle.

Similarly for proc0__f1, proc0__f2 and proc0__f3, depending on the mode, combinations of products from the level 1 processor of FIG. 4 are available as signal outputs from the level 2 processing stage. Signals such as db0, db1, db2 and db3 of FIG. 5 are used to load startup conditions.

The output signals from the level 2 processing may be placed onto the CTC buses shown in FIG. 1. That is, any of the four outputs from the second level processing section of each of the four processor groups on a chip (a total of 16 signals) may be output onto predetermined pads such as pads 206 in FIG. 2. The twelve 16:1 multiplexers and tristate buffers, shown as box 214 of FIG. 2, allow placement of any of the 16 signals onto the pads.

Figure 5B:
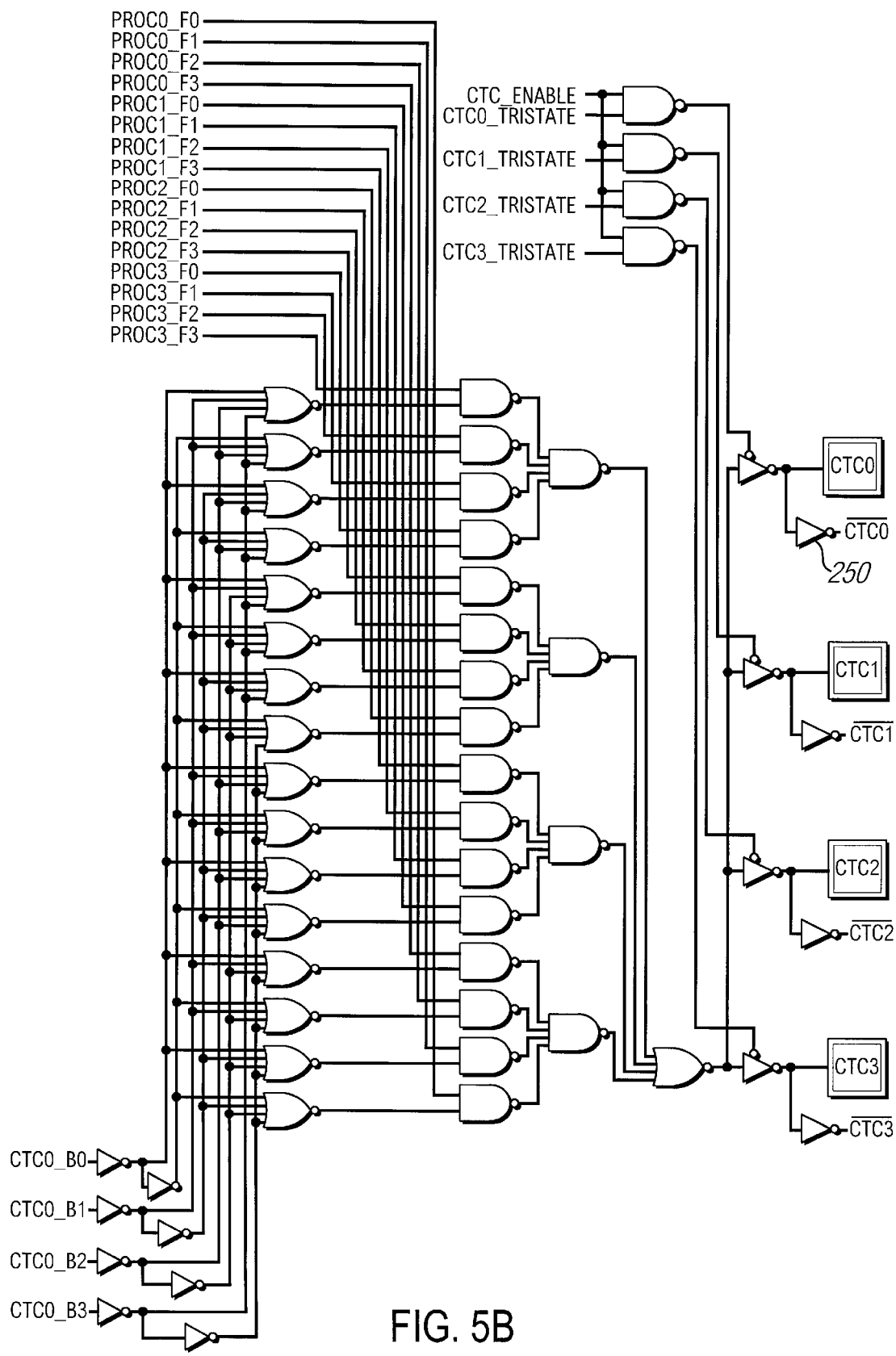

FIG. 5B shows a portion of specific circuitry to accomplish the function of box 214 of FIG. 2. In FIG. 5B, the 16 signals, proc0__f0 through proc3__f3, are placed onto four pads by use of the selection signals ctc0__b0 through ctc0__b3 and tristate enable signals ctc0_tristate through ctc3_tristate. The circuitry of FIG. 5B is replicated 11 more times so that a total of 48 pads is provided with any of the 16 signals, as desired.

Pads 206 of FIG. 2 are also used to read data from other chips via the CTC buses described in connection with FIG. 1, above. Box 216 of FIG. 2 shows additional multiplexers for accomplishing the assignment of signals read from the pads to bus lines connected to the processors. The bus width is 48-bits, made up of four 12-bit buses.

Figures 1, 5C:
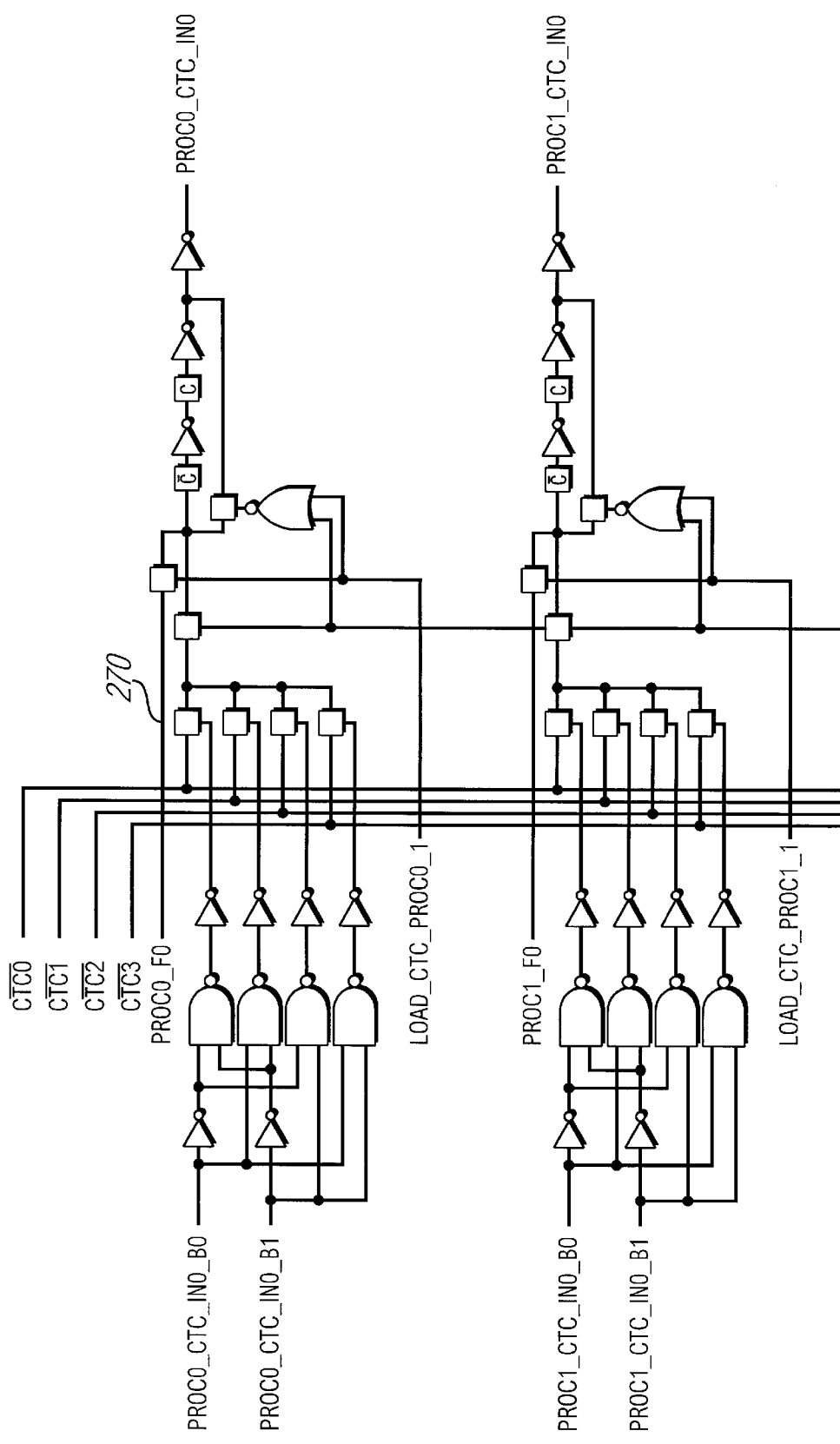
Figures 2, 5C:
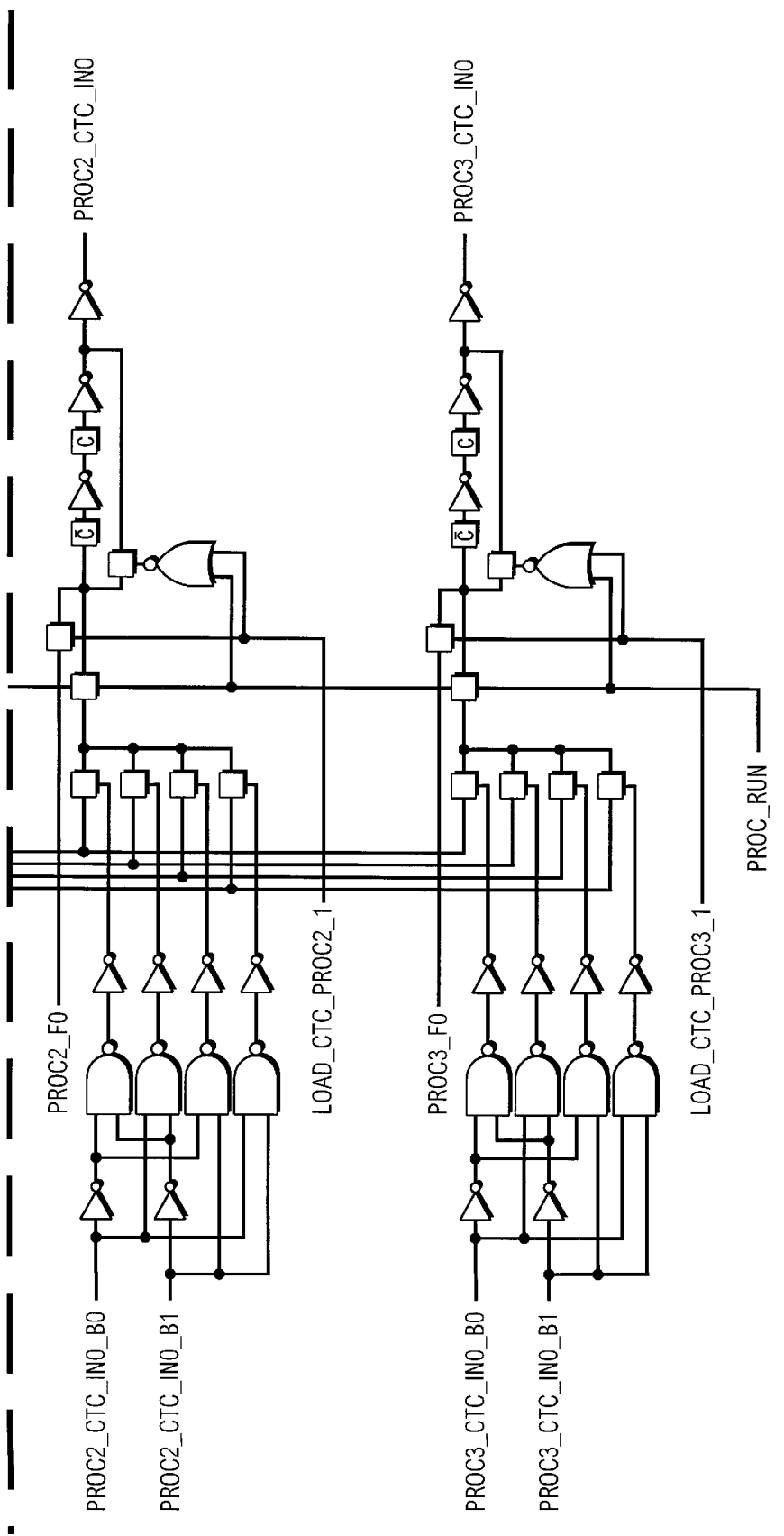

FIGS. 5C-1 and 5C-2 shows a portion of specific circuitry to implement the function of box 216 of FIG. 2. The circuitry of FIG. 5B handles the routing of four of the 48 pads 206 of FIG. 2. Signals from the pads are labelled "not ctc0" through "not ctc47" (in the Figure, inversion bars are used over the terms in place of the text "not"). These signals are obtained from the pads through buffers such as buffer 250 of FIG. 5B. The signals are applied to the buses via selection signals at the left of FIG. 5B that enable pass gates such as pass gate 270. Pass gates such as pass gate 270 are represented as a square with the gate signal at the bottom. The gates are enabled upon application of a high signal at the gate.

Inputs such as proc0__f0 facilitate initialization of the emulator by allowing values from level 1 and 2 processing to be loaded prior to a run. For example, for the topmost stage in FIG. 5B, the result proc0__f0 is applied to the bus via signal load_ctc_proc0__1. In a preferred embodiment, signals from level 1 and 2 processing are not routed through the circuitry of FIGS. 5C-1 and 5C-2 once the emulator is running.

The circuitry of FIG. 5C-1 and 5C-2 is replicated 11 more times to account for all of the 48 signals available from the pads.

Thus, the architecture of the emulation system of the present invention has been disclosed above. It is shown from the FIGS. and accompanying discussion that the present invention provides an architecture for parallel processing to determine solutions of logical equations in order to emulate a user circuit. The architecture of the present invention uses a system clock that is operable in predetermined modes so that a whole number multiple, n, of emulator cycles is associated with the cycle time of the system clock in the user circuit being emulated. Also, the architecture of the present invention provides a routing scheme so that gates in the processor structure may be used in the emulation of various gates in the user circuit.

In summary, in a preferred embodiment a user's circuit is converted into boolean equations that are solved by the level 1 and 2 processing stages. This means that there is no direct mapping of physical gates in the user's circuit to gates in the emulator. Also, in a typical operation of the emulator the level 1 and 2 processing stages are used multiple times within a given user system clock cycle. This is because the processing is controlled by an emulator control program that executes multiple steps within a user clock cycle and a step usually includes computation by the level 1 and 2 processing stages.

Example of a User Circuit

Figure 6:
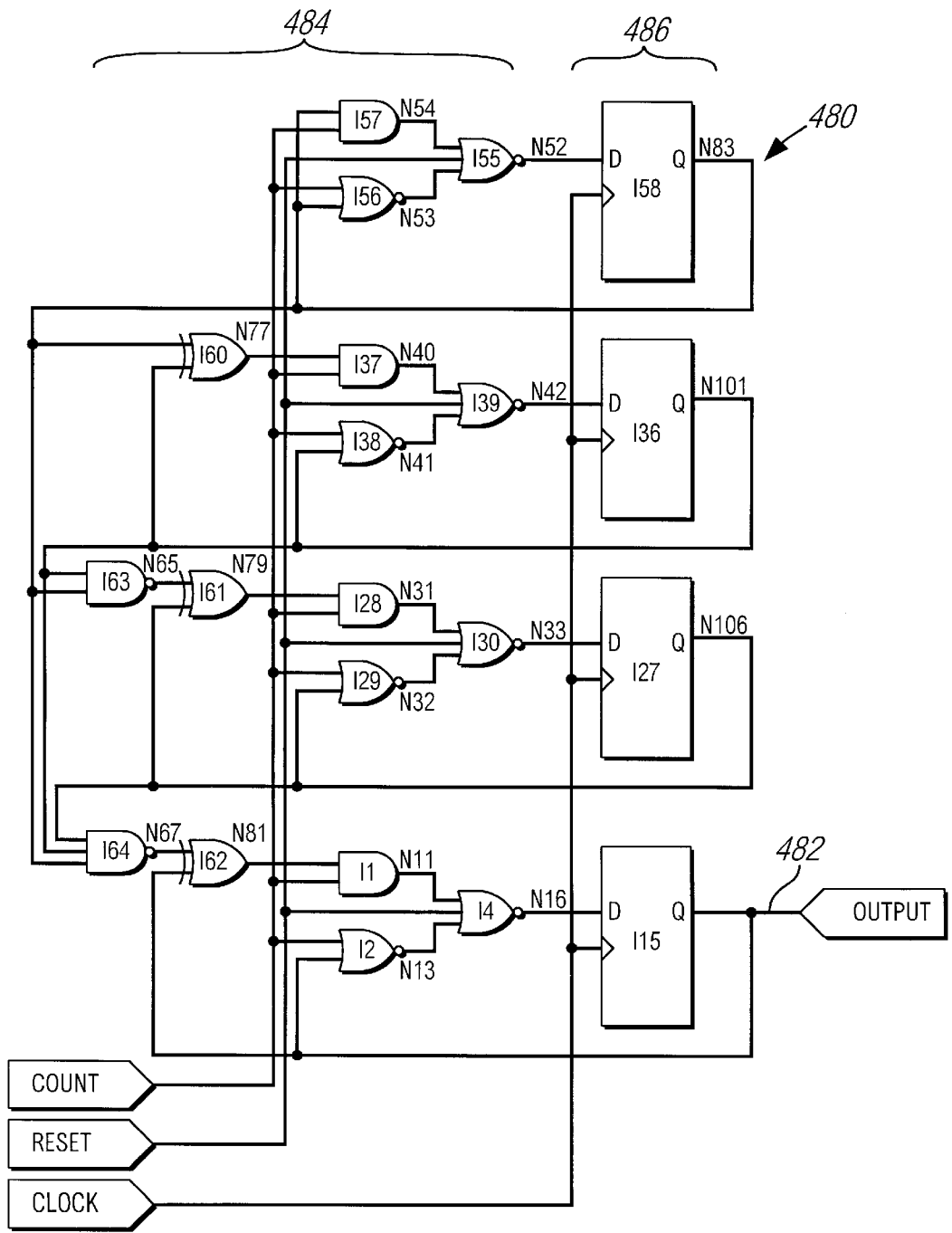
FIG. 6 shows an example of a user circuit.

FIG. 6 shows an example of a user circuit that will be used to further describe the functioning of the emulation system of the present invention.

FIG. 6 shows a simple binary counter 480 with input signals COUNT, RESET AND CLOCK. The output of binary counter 480 is OUTPUT at 482. Binary counter 480 includes combinatorial circuitry at 484 consisting of discrete gates and flip-flops at 486 clocked by signal CLOCK. The functioning of binary counter 480 is well known.

In order for the emulation system of the present invention to emulate binary counter 480 a logical description of the counter must be loaded into the control RAM of the emulation system. The creation of the logical description from the circuit description may occur in several steps. In fact, many ways of representing the logical circuitry of binary counter 480 are possible and within the scope of the invention. The discussion below translates binary counter 480 into a circuit description that uses inverters and NOR gates, along with synchronous pass gates, to achieve a logical description with identical operation to that of binary counter 480.

Figure 7:
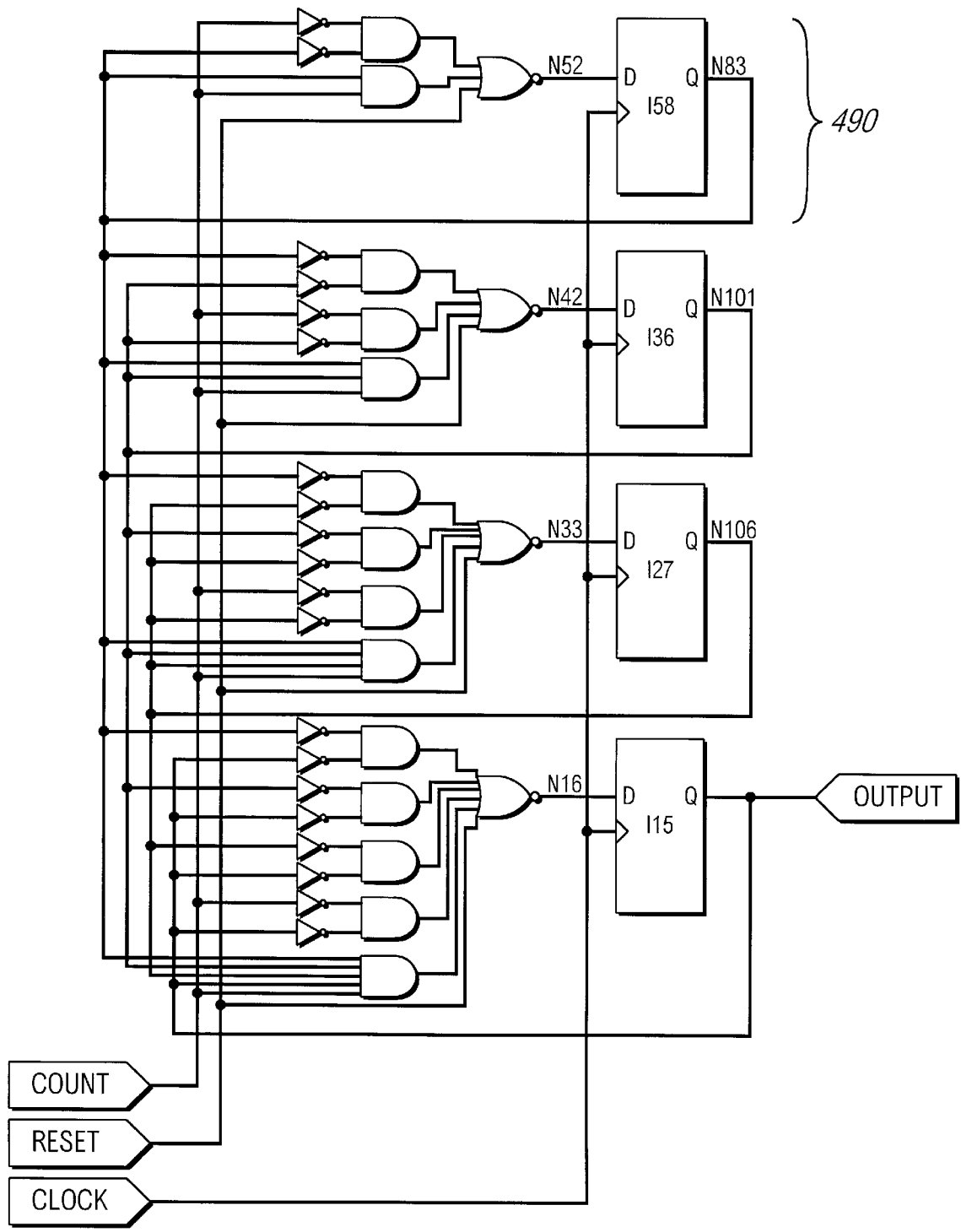
FIG. 7 shows a first step in the translation or compilation of the logical description for the circuit of FIG. 6.

FIG. 7 shows a first step in the translation or compilation of the logical description for the counter of FIG. 6. In FIG. 7, the multi-level logic at 484 of FIG. 6 has been transformed into 2 level logic, including inverters as necessary.

Figure 8A:
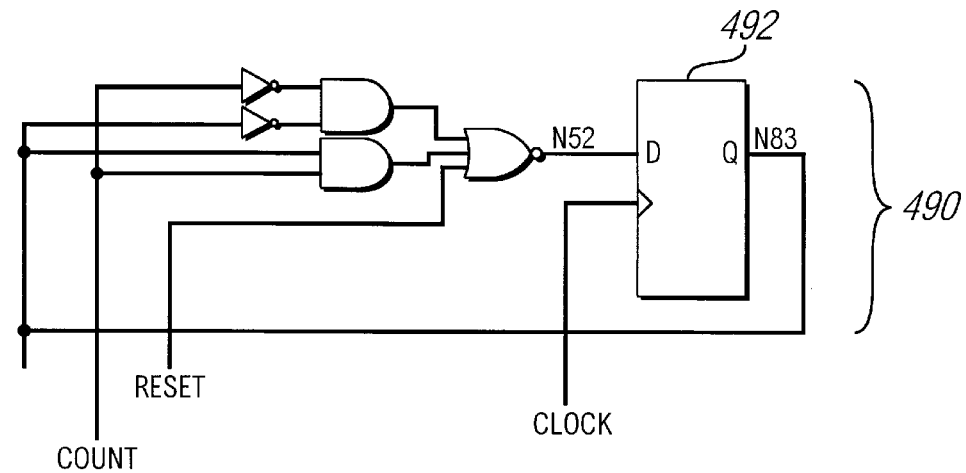
FIG. 8A shows a second step in the conversion of a portion of the circuit of FIG. 7.
Figure 8B:
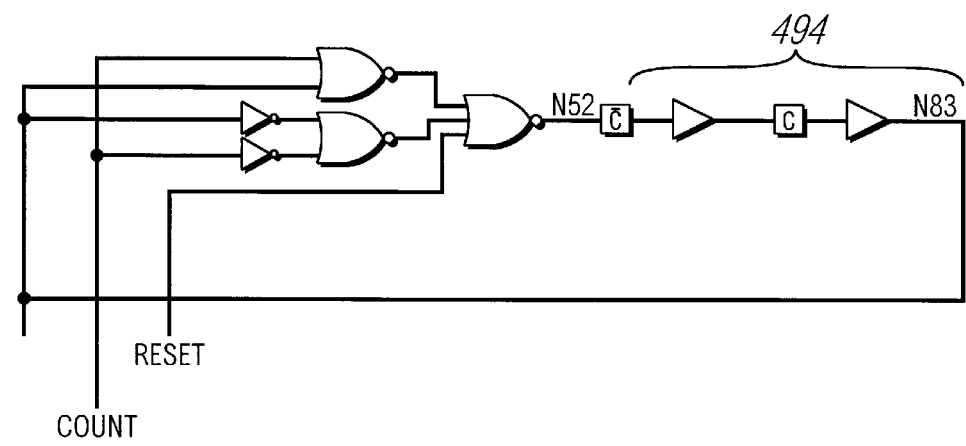
FIG. 8B shows a third step in the conversion of a portion of the circuit of FIG. 7.
Figure 8C:
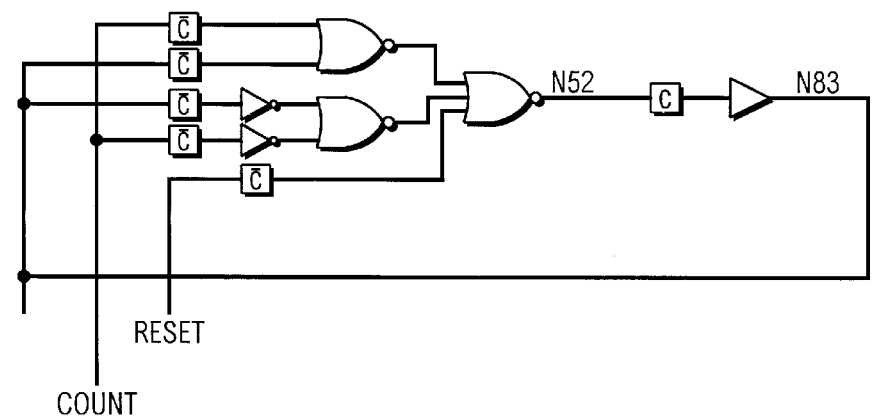
FIG. 8C shows a fourth step in the conversion of a portion of the circuit of FIG. 7.

FIGS. 8A–C show the conversion of a portion of the circuit of FIG. 7 to an implementation using pass-gates and OR/NOR logic.

In FIG. 8A a portion 490 of the circuit of FIG. 7 is shown. In FIG. 8B the same portion has been translated into an implementation using pass-gates and OR/NOR logic. Note that D flip-flop 492 has been converted into a series of pass-gates and buffers at 494 in FIG. 8B. The meaning of the pass-gates are shown at the legend at the bottom of the page of FIGS. 8A–C.

It is a goal in the translation or compilation of a logic description for the emulation system of the present invention to move as much of the combinatorial logic as possible between clock bar and clock type pass-gates. Therefore, the conversion from FIG. 8B to the circuit shown at FIG. 8C places all of the combinatorial logic between clock bar and clock pass-gates. It is readily verifiable that the circuits of FIG. 8B and 8C are identical in terms of the output, or signal n83, and its response to inputs count and reset.

Figure 9:
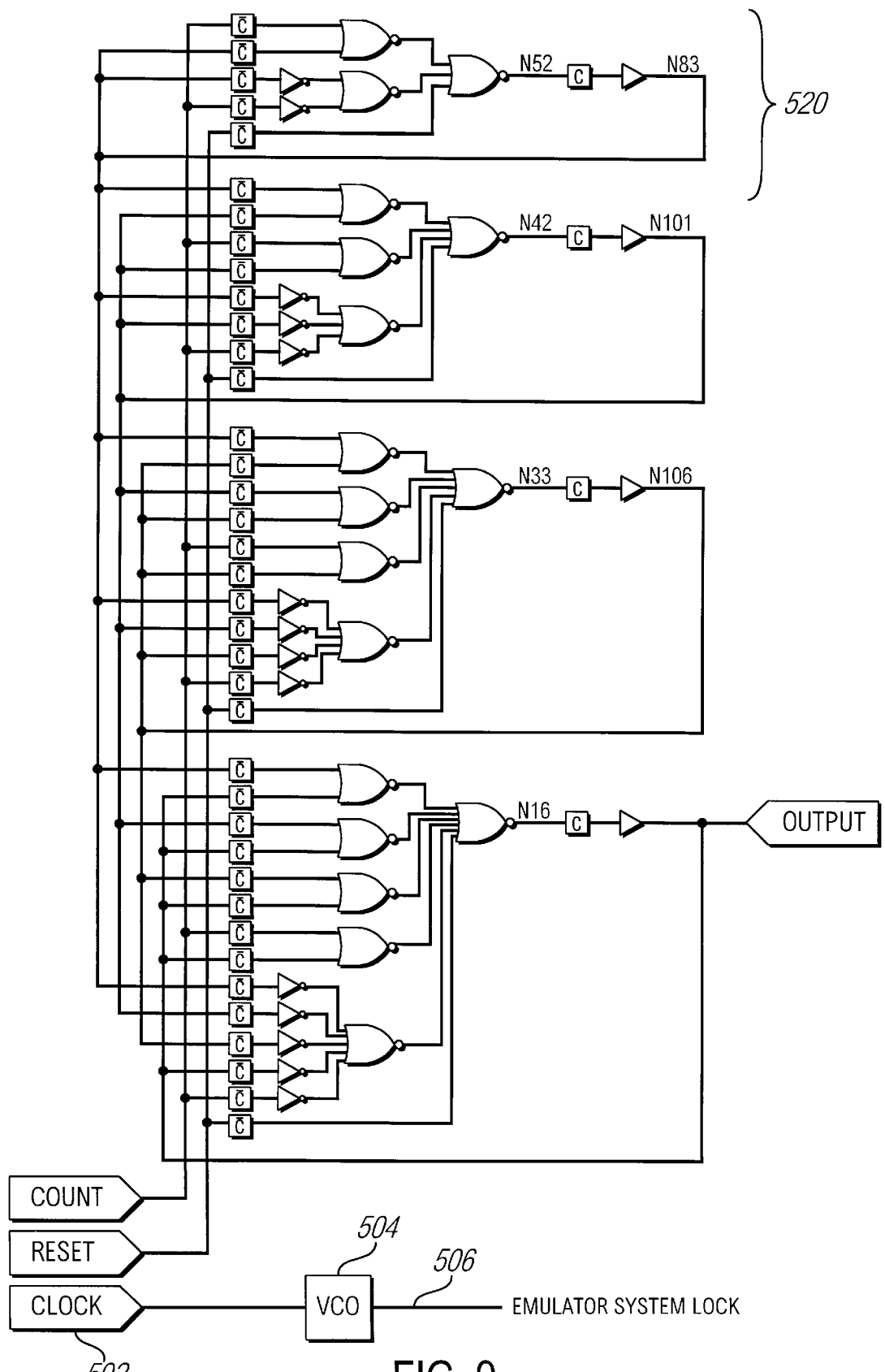
FIG. 9 shows the circuit of FIG. 7 after transformational steps of FIGS. 8A–C are implemented.

FIG. 9 shows the circuit of FIG. 7 after transformational steps of FIGS. 8A–C are implemented. The circuit of FIG. 9 performs the same function as the circuit of FIG. 6. Also, the same inputs and outputs are present. Note that, in FIG. 9, clock signal at 502 is fed into VCO 504. VCO 504 is a phase locked loop that multiplies the clock frequency an integral number of times for use as the emulator system clock 506. The emulator system clock is used as the processing clock. That is, each cycle of the emulator system clock allows one step in the control program to execute. Since all of the combinatorial circuitry in FIG. 9 is shown between "clock bar" and "clock" pass-gates, in theory, one would be able to emulate the operation of the circuit of FIG. 9 in a single emulator system clock cycle. However, for purposes of illustration, the emulation according to a program stored in the emulator's control RAM uses three steps, or emulator system clock cycles, to perform the emulation. The logical representation of binary counter 480 of FIG. 6 according to the logical system of FIG. 9 requires that the logical description of FIG. 9 be compiled into program form. This program form is represented in the tables of FIGS. 10 and 11A–D.

Control Program Execution

Next, FIGS. 10, 11A–D and 12 are discussed to describe the emulation of the circuit of FIG. 6 according to an emulator control program.

Figure 12:
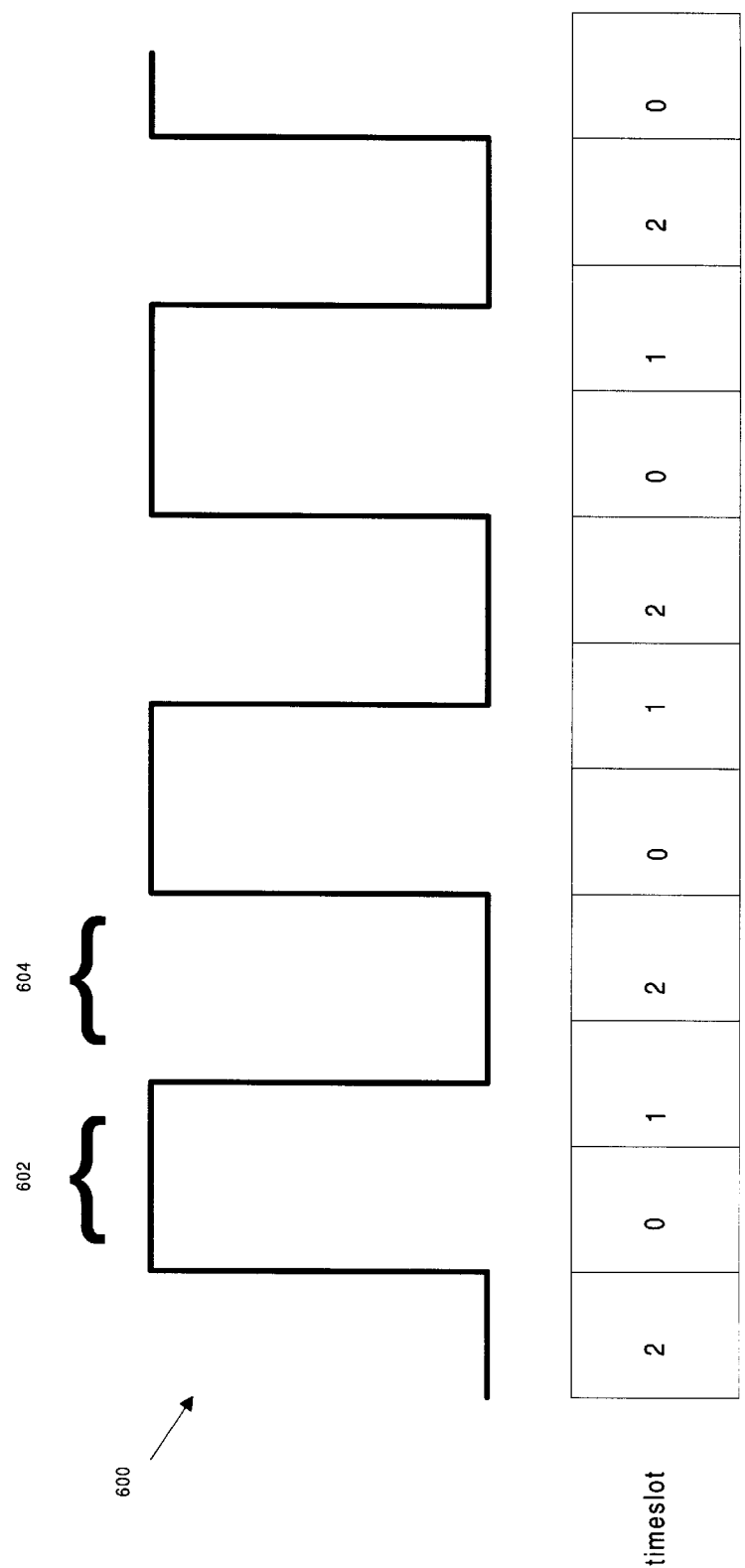
FIG. 12 shows a clock waveform and timeslots.

FIG. 12 shows a clock waveform 600 of the user system clock and timeslots related to the waveform. The clock waveform 600 has a period made of a high interval 602 and a low interval 604. In the present example, the emulator operates in the exception synchronous mode so that the emulator system clock frequency is fN, as discussed above. The emulator program is three steps long (i.e., N=3) so that the emulator system clock operates three times as fast as the user system clock. This allows three emulator control program steps to be performed in one period of the user system clock.

The control program consists of three steps, or timeslots, referred to as timeslots 0, 1 and 2. Each iteration of the program completes in one cycle of the user system clock as shown in FIG. 12 since the three timeslots are repeated for each period of the user system clock.

FIG. 10 shows a processor map of an emulator control program for emulating the circuit of FIG. 6. The control program uses four processors. Each processor is operated in the level 2 processing mode 1. That is, each level two processing group is split into a sum of gates0–5 of the first level processing group as output proc0\_f0 and a sum of gate6 and gate7 as output proc0\_f2. See Table 1 and the discussion above for a description of the level 2 processing modes. In FIG. 10, the operation of each of the two level 2 processing functions proc0\_f0 and proc0\_f2 is indicated as a "subprocessor" and designated as S0 or S1, respectively.

Thus, the leftmost column of FIG. 10 shows processor 0, subprocessor 0 as P0-S0. Processor 0, subprocessor 1 as P0-S1. Processor 1, subprocessor 0 as P1-S0, etc. This indicates that each of the four processors used in the emulation is capable of calculating two product sums. The first product sum uses six of the possible outputs from level 1 processing while the second product sum uses the remaining two outputs from level 1 processing.

The columns to the right of each processor-subprocessor label show the function to be performed by the processor-subprocessor for the indicated timeslot. For P0-S0, the function in timeslot 0 is to buffer the signal N83. This means that the value corresponding to signal N83 of FIG. 6 is available as an output of the level 2 processing for processor 0 (proc0\_f0) at the end of timeslot 0. For P0-S1 a value corresponding to COUNT in FIG. 6 is available at proc0\_f2 at then end of timeslot 0.

The row corresponding to "other instructions" in FIG. 10 shows miscellaneous operations not relating to the outputs of the processor groups. For example, in timeslot 0 the value of the signal OUTPUT is made available at one of the output pads. In timeslot 2 the input signals COUNT and RESET are latched at input pads to the emulator.

FIG. 11A describes in detail the steps of the emulator control program. For ease of discussion, the control program is presented in several "pseudo code" tables that describe only the essential operations. The actual implementation of the emulator control program is by microcode as is known in the art. Further, other sequences, arrangements or selections of instructions may be used to achieve the functions of the control program illustrated in FIGS. 11A–D.

The left column of the pseudo code tables in FIGS. 11A–D shows the assignment of operands to each gate in the level 1 processing for a given processor-subprocessor combination. For example, in FIG. 11A, processor 0, subprocessor 0 has the signal N83 assigned as operands 0 through 7. In other words, all inputs to gate0 of FIG. 4 are applied with the signal from P0S0. This is the signal proc0\_f0, as describe above. In order to understand this first instruction a few points need to be understood.

First, the operation of the control program is assumed to be in the "steady state". That is, the startup conditions for the emulation of the circuit are not discussed here and it is assumed that the emulation has been proceeding for some time before the execution of the steps shown in the pseudo code tables. Signal N83 is being read from the bus line corresponding to P0S0, or proc0_f0, because in the steady state of operation the value for N83 would be computed in a previous timeslot, timeslot 2, and is available for use in timeslot 0. Second, there is no provision in the given design of level 1 processing to handle unused inputs (i.e., no way to input a "1" to the gates). Since only one operand, N83, is to be presented to gate0, it is supplied to each of gate0's inputs. The replication of a signal in a logical product has no effect on the outcome of the logical operation. Third, P0S0 in timeslot 0 performs the simple function of buffering the value N83 for use in timeslot 1, discussed below. This allows the signals COUNT and RESET to be read and made available by other processor-subprocessor combinations, as discussed below.

In the pseudo code table of FIG. 11A, gates 1–5 in processor 0, subprocessor 0, timeslot 0 are not used and are disabled.

Figure 9A:
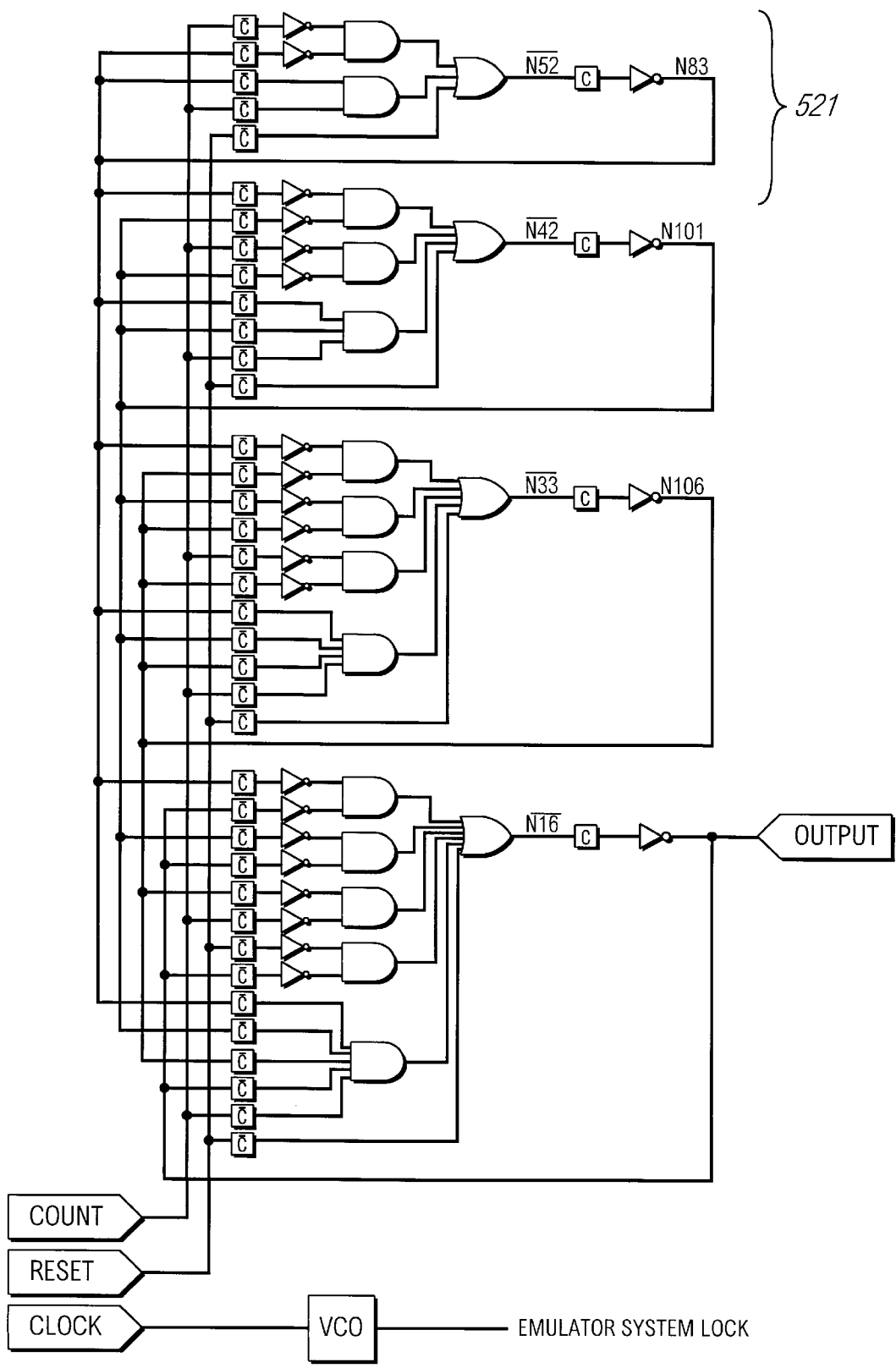
FIG. 9A shows the circuitry of FIG. 9 in AND/OR logic.

FIG. 9A shows the circuitry of FIG. 9 in AND/OR logic. FIG. 9A should be consulted throughout the following discussion since the logic described in the pseudo code tables is in terms of AND/OR logic. In a preferred embodiment, a compiler generates both AND/OR logic and OR/NOR logic for purposes of optimization, placement and routing of the emulated user circuit.

For processor 0, subprocessor 0 (P0S0) in timeslot 1 the value of N52 is computed so that it will be available at the start of timeslot 2. This is achieved by having P0S0 compute the sum of products for N52. As shown in FIG. 9, the sum-of-products for N52 (and N83) is computed by the combinatorial logic at 520 of FIG. 9, or, equivalently, the logic at 521 of FIG. 9A. This is given by the equation not((not(COUNT) "not(N83))+(N83 "COUNT)+RESET).

The first term in the sum-of-products form, (not(N83 "not(COUNT)), is calculated in timeslot 1 by gate0 as shown in FIG. 11A. Gate0 is applied with COUNT (from P0S1) as operand 0 and with N83 (from P0S0) as operands 1–7. The operands are inverted by having the signals polarity_proc0_gate0_inp0 and polarity_proc0_gate0_inp1 of FIG. 4 high.

The second term in the sum-of-products form is (N83 "COUNT). This is calculated in timeslot 1 by gate1 as shown in FIG. 11A. Gate1 is applied with COUNT as operand 0. Similarly, N83 is applied to gate 1 as operand 0. The product (COUNT © N83) is thus obtained in timeslot 1.

The third term in the sum-of-products form is RESET. This is obtained in timeslot 1 of FIG. 11A as operand 0 to gate2 for P0S0. Gates 3 through 5 are disabled. Since gates 0 through 5 are summed by the circuitry in level 2 processing shown in FIG. 5, this yields the sum-of-products result "not N52" at proc0_f0 in FIG. 5.

In timeslot 2, the signal value for N83 is computed. Since N83 is the same as (not N52), this just requires that the value for N52 computed in the previous timeslot be fed through the P0S0 arrangement to be available at the output of P0S0 and inverted for the next timeslot. Thus, the inverted signal from P0S0, or signal (not N52), is applied to all inputs of gate0 in timeslot 2. While the inversion is done with the signals in the level one processing it could also be done with the signal pc12p0i0 of level two processing in FIG. 5 by placing the latter signal low.

Note that in order for the signals COUNT and RESET to be available for use in timeslot 1 for P0S0 they must be provided at the outputs of a level 2 processing structure.

COUNT is obtained via P0S1 in timeslot 0 as shown in FIG. 11A. The COUNT signal is read from the local storage shift register, first bit position, designated as "Delay 0."Similarly, RESET is obtained via P1S1 as shown in FIG. 11B.

The remaining steps in the pseudo code tables shown in FIGS. 11A–D function similarly to compute the values for N42, N01, N33, N106, N16 and OUTPUT.

In the foregoing specification, the invention has been described with reference to a specific exemplary embodiment thereof. It will, however, be evident that various modifications and changes may be made thereunto without departing from the broader spirit and scope of the invention as set forth in the appended claims. Many changes or modifications will be readily apparent to one of ordinary skill in the art. The specification and drawings are, accordingly, to be regarded in an illustrative rather than a restrictive sense, the invention being limited only by the provided claims.

What is claimed is:

1. An emulator which emulates the operation of a user circuit, wherein said user circuit is described by logic equations, wherein said user circuit includes a user clock signal having a user frequency, said emulator comprising:

a clock multiplier coupled to said user clock signal which generates an emulator clock signal that is an integer multiple, n, times faster than the user frequency, wherein n is greater than 1;

a first plurality of processors which generate solutions to logic equations that emulate said user circuit;

an emulator control program coupled to said first plurality of processors which controls the solutions of said logic equations, wherein said emulator control program is further coupled to said emulator clock signal and causes one or more logic equations to be solved each n cycles of said emulator clock;

a level one processor structure which receives input signals and outputs selected logical product combinations of said input signals as a second plurality of outputs;

a level two processor structure which receives said second plurality of outputs from said level one processor structure and selectively combines said second plurality of outputs into a sum of products solution; and wherein a third plurality of control signals are generated by said emulator control program which configure said second plurality of outputs of said level one processor structure into two or more sum of product signals wherein said third plurality of control signals allows said level two processor structure to divide the summing of said second plurality of outputs into two or more sets of outputs, thereby providing two or more outputs from said level two processor structure.

2. The emulator of claim 1, wherein said second plurality of outputs comprises eight outputs and said third plurality of control signals allows said level two processor structure to group the summing of said second plurality of outputs as any one of the following configurations; one eight-product sum, one six-product sum and one two-product sum, two four-product sums, one four-product sum with one two-product sum and two one-product outputs.

3. An emulator which emulates the operation of a user circuit, wherein said user circuit is described by logic equations, wherein said emulator includes an emulator clock generator which generates a clock signal having an emulator frequency, wherein said user circuit includes a user clock signal having a user frequency that is not more than half as fast as said emulator frequency, said emulator comprising:

a first plurality of processor groups which generates solutions to a first set of logic equations that emulate said user circuit;

an input which receives said user clock signal and providing said user clock signal as an input signal to said first plurality of processor groups;

an emulator control program coupled to said first plurality of processor groups which controls the solution of the logic equations, wherein said emulator control program is further coupled to said emulator clock signal and causes one or more logic equations to be solved each n cycles of said emulator clock;

a level one processor structure which receives a second plurality of input signals and outputs selected logical product combinations of said second plurality of input signals;

a level two processor structure which receives product combinations from said level one processor structure and selectively combines said products into a sum of products solution; and wherein a third plurality of control signals are generated by said emulator control program which configure said level two processor structure to sum said product combinations of said level one processor structure into two or more sum of product signals.

4. The emulator of claim 3 further comprising:

wherein said level one processor structure provides eight outputs to said level two processor structure; and wherein said third plurality of control signals allows said level two processor structure to divide the summing of the eight outputs into two or more groups of less than eight outputs, thereby providing two or more outputs from said level two processor structure.

5. The emulator of claim 4 wherein said third plurality of control signals allows said level two processor structure to group the summing of said eight outputs as any one of the following configurations: one eight-product sum, one six-product sum and one two-product sum, two four-product sums, one four-product sum with one two-product sum and two one-product outputs.

6. The emulator of claim 5, further comprising:

an input coupled to said first plurality of processor groups which accepts a value used in said logic equations;

local storage which stores and outputs a solution comprising a logical product combination generated by said first plurality of processor groups; and a routing network coupled to said emulator control program wherein said routing network is further coupled between said local storage and said first plurality of processor groups to allow selectively routing said solution back to said input of said first plurality of processor groups under control of said emulator control program.

7. An emulator which emulates the operation of a user circuit, wherein said user circuit is described by logic equations and said user circuit includes a first collection of logic gates and a second collections of logic gates which perform a first logic function and a second logic function, respectively, said emulator comprising:

an emulator control program including a plurality of program steps which control emulation of said user circuit in accordance with a first set of predetermined logic equations;

a processor group including a first processing logic gate, wherein said processor group emulates said first logic function and said second logic function in response to a plurality of control signals from said emulator control program;

wherein a first program step in said emulator control program causes said first processing logic gate to be used to emulate a portion of said first logic function;

wherein a second program step in said emulator control program causes said second processing logic gate to be used to emulate a portion of said second logic function;

a level one processor structure which receives input signals and outputs a first set of selected logical product combinations of said input signals;

a level two processor structure which receives said first set of selected logical product combinations from said level two processor structure and selectively combines said first set into a sum of products solution; and wherein a second set of control signals configures said level two processor structure to divide the summing of said first set into two or more sum of product signals thereby providing two or more outputs from said level two processor structure.

8. The emulator of claim 7 wherein said first set comprises eight outputs and said second set of control signals allows said to a level two processor structure to group the summing of said eight outputs as any one of the following configurations: one eight-product sum, one six-product sum and one two-product sum, two four-product sums, one four-product sums, one four-product sum with one two-product sum and two one-product outputs.

9. The emulator of claim 8 further comprising:

wherein said processor group includes an input which accepts a value used in the solution of said logic equations;

a local storage which stores and outputs said solutions generated by said processor group; and a routing network coupled to said emulator control program, wherein said routing network is further coupled between said local storage and said processor group to allow said emulator control program to selectively route a stored solution back to said input of said processor group.

10. The emulator of claim 9 wherein said local storage comprises one or more shift registers.

11. An emulator, responsive to receiving a user circuit description, said user circuit description describing a user circuit having multiple user gates executing at a user frequency, the operation of said user gates being described by a set of logic equations including at least first and second subsets of logic equations, the emulator comprising:

an emulator clock circuit that generates an emulator clock signal having an emulator frequency greater than said user frequency such that a user circuit clock cycle corresponds to at least a first emulator clock cycle and a second emulator clock cycle;

a control circuit that provides a control program; and a reconfigurable processor group coupled to said emulator clock circuit and being responsive to said control program;

wherein said control program configures said reconfigurable processor group to generate a first set of solutions to said first subset of logic equations during said first emulator clock cycle, wherein said control program reconfigures said reconfigurable processor group to generate a second set of solutions to said second subset of logic equations during said second emulator clock cycle.

12. The emulator of claim 11 further comprising:

a local storage which stores said first set of solutions and feeds back said first set of solutions to said reconfigurable processor group to generate said second set of solutions.

13. The emulator of claim 12,
wherein said set of logic equations further includes a third subset of logic equations,
wherein said user circuit clock cycle corresponds to at least said first emulator clock cycle, said second emulator clock cycle, and a third emulator clock cycle,
wherein said third emulator clock cycle is between said first emulator clock cycle and said second emulator clock cycle,
wherein said control program reconfigures said reconfigurable processor group to generate a third set of solutions to said third subset of logic equations during said third emulator clock cycle.

14. The emulator of claim 12, said emulator further comprising:
an emulator input port coupled to said reconfigurable processor group wherein said first set of solutions is generated using a signal received from said emulator input port; and
an emulator output port coupled to said reconfigurable processor group wherein said emulator output port is responsive to a subset of said first set of solutions and said second set of solutions.

15. The emulator of claim 11 wherein said control circuit includes a compiler which takes said user circuit description as input and creates a set of program steps.

16. The emulator of claim 11 wherein said emulator clock circuit includes a clock multiplier circuit which multiplies said user clock signal by a constant, n to generate said emulator clock signal so that said emulator frequency is a whole number multiple of said user frequency.

17. The emulator of claim 11
wherein said emulator frequency is at least two times greater than said user frequency.

18. The emulator of claim 11 wherein said reconfigurable processor group further comprises:
a bus which receives a set of inputs to said reconfigurable processor group;
a level one processor structure coupled to select a subset of inputs from said bus; and
a level two processor structure coupled to said level one processor structure to receive said subset of inputs and generate said first set of solutions.

19. The emulator of claim 18 wherein said level one processor structure comprises multiplexers, exclusive OR gates, and NOR gates.

20. The emulator of claim 19 wherein said level two processor structure produces between one and four outputs under control of said control program.

21. The emulator of claim 20 wherein said local storage comprises a set of shift registers coupled to said level two processor structure.

22. An emulation system which emulates the operation of a user circuit, said user circuit having a user clock signal with a user frequency, said emulator comprising:
an emulator clock generator which generates an emulator clock signal having an emulator frequency greater than said user frequency;
a compiler which creates a control program by compiling a representation of said user circuit, said control program operating at said emulator frequency and having N steps;
a reconfigurable processor controlled by said control program which produces a first emulated result and a second emulated result of said operation of said user circuit during a user clock cycle;
an emulator input circuit, controlled by said control program, which selectively inputs a user input; and
an emulator output circuit, controlled by said control program, which selectively outputs an emulated output of said user circuit.

23. An emulator which emulates the operation of a user circuit having a user clock signal with a user frequency during a user clock cycle, said user circuit described by a first logical equation and a second logic equation, said emulator comprising:
a clock multiplier which multiplies said user frequency to produce an emulator clock signal having an emulator frequency that is greater than said user frequency so that a first plurality of emulator clock cycles occur during said user clock cycle, said first plurality of emulator clock cycles including a first emulator clock cycle and a second emulator clock cycle;
a control circuit that provides a control program;
a reconfigurable processor group which is configured by said control program during said first emulator clock cycle to solve said first logic equation and subsequently reconfigured by said control program during said second emulator clock cycle to solve said second logic equation;
an emulator input port, coupled to said reconfigurable processor group, which receives a user input value during said user clock cycle and selectively feeds said user input value to said reconfigurable processor group; and
an emulator output port, coupled to said reconfigurable processor group, which selectively outputs a second solution of said second logic equation as an emulated output of said user circuit during said user clock cycle.

24. The emulator of claim 23 further comprising:
feedback logic coupled to said reconfigurable processor group which feeds back a first solution of said first logic equation to said reconfigurable processor group.

25. The emulator of claim 24 wherein said control circuit creates said control program by compiling a description of said user circuit.

26. The emulator of claim 25 wherein said reconfigurable processor group further comprises:
a processor input which accepts a first input in said first emulator clock cycle and a second input in said second emulator clock cycle;
a control input which accepts a first control signal from said control program in said first emulator clock and a second control signal in said second emulator clock signal, said first control signal causing a gate of said reconfigurable processor group to solve a first boolean equation using said first input and said second control signal causing said gate of said reconfigurable processor group to solve a second boolean equation using said second input; and
a processor output which outputs a result of said second boolean equation.

27. The emulator of claim 26 wherein said user frequency is f, said control program has N steps, and said emulator frequency is 2fN.

28. The emulator of claim 23 wherein said user circuit is further described by a third logic equation, said emulator further comprising:
a second reconfigurable processor group which is configurable by the control program to solve said third logic equation; and a feedback line which selectively feeds back a solution of said first logic equation to said second reconfigurable processor group.

29. A method for emulating a user circuit having a clock signal with a user frequency using an emulator, the emulator operating at an and including a reconfigurable processor group, said method comprising the steps of:

setting a frequency of said emulator clock signal to be greater than said user frequency, so that a user clock cycle of said user circuit includes a first emulator clock cycle and a second emulator clock cycle;

configuring said reconfigurable processor group to emulate a first selected portion of said user circuit during said first emulator clock cycle thus producing a first result;

reconfiguring said reconfigurable processor group to emulate a second selected portion of said user circuit during said second emulator clock cycle thus producing a second result;

combining said first result and said second result to produce an emulated output; and outputting said emulated output.

30. The method of claim 29 further comprising the steps of:

inputting a user input value to said emulator; and emulating said first selected portion using said user input value.

31. The method of claim 30 wherein said combining step further comprises the steps of:

feeding said first result back to said reconfigurable processor group;

inputting said first result as an input value of said second selected portion; and emulating said second selected portion using said input value.

32. The method of claim 30 wherein said configuring step further comprises the step of inputting a first control signal to said reconfigurable processor group to selectively control the operation of said reconfigurable processor group and said reconfiguring step further comprises the step of inputting a second control signal to said reconfigurable processor group to selectively control the operation of said reconfigurable processor group.

* * * * *